(12) United States Patent
Hsu et al.

(10) Patent No.: US 8,921,988 B2
(45) Date of Patent: Dec. 30, 2014

(54) GALVANICALLY-ISOLATED DEVICE AND METHOD FOR FABRICATING THE SAME

(71) Applicant: Neoenergy Microelectronics, Inc., Chupei, Hsinchu County (TW)

(72) Inventors: Wei-Chan Hsu, Chupei (TW); Li-Te Wu, Chupei (TW); Cheng-Feng Shih, Chupei (TW)

(73) Assignee: Neoenergy Microelectronics, Inc., Chupei, Hsinchu County (TW)

( * ) Notice: Subject to any disclaimer, the term of this patent is extended or adjusted under 35 U.S.C. 154(b) by 0 days.

(21) Appl. No.: 14/142,157

(22) Filed: Dec. 27, 2013

(65) Prior Publication Data

US 2014/0183698 A1  Jul. 3, 2014

Related U.S. Application Data

(60) Provisional application No. 61/747,129, filed on Dec. 28, 2012.

(51) Int. Cl.
| | |
|---|---|
| *H01L 23/495* | (2006.01) |
| *H01L 49/02* | (2006.01) |
| *H01L 23/522* | (2006.01) |
| *H01L 23/58* | (2006.01) |

(52) U.S. Cl.
CPC ............ *H01L 28/40* (2013.01); *H01L 23/5223* (2013.01); *H01L 23/49589* (2013.01); *H01L 2224/48091* (2013.01); *H01L 2224/73265* (2013.01); *H01L 23/49575* (2013.01); *H01L 23/585* (2013.01)
USPC .......................................... 257/676; 257/500

(58) Field of Classification Search
CPC .................................................. H01L 23/49589
USPC ................................................... 257/500, 676
See application file for complete search history.

(56) References Cited

U.S. PATENT DOCUMENTS

| | | | |
|---|---|---|---|
| 7,295,448 B2 * | 11/2007 | Zhu .................................. | 363/17 |
| 7,919,781 B2 * | 4/2011 | Wang et al. ....................... | 257/82 |
| 8,659,149 B2 * | 2/2014 | French et al. .................. | 257/725 |
| 8,674,486 B2 * | 3/2014 | Haigh et al. ................... | 257/676 |
| 2005/0270806 A1 * | 12/2005 | Zhu .................................. | 363/17 |

* cited by examiner

*Primary Examiner* — Nicholas Tobergte
(74) *Attorney, Agent, or Firm* — Muncy, Geissler, Olds & Lowe, P.C.

(57) ABSTRACT

A galvanically-isolated device and a method for fabricating the same are provided. The galvanically-isolated device includes a lead frame including a first die-attach pad, a first lead and a second lead. A substrate is disposed on the first die-attach pad. A high-voltage semiconductor capacitor formed on the substrate includes an interconnection structure. The interconnection structure includes an inter-metal dielectric layer structure. A first plate, a second plate and a third plate are formed on the inter-metal dielectric layer structure, separated from each other. The first plate, the second plate and a first portion of the inter-metal dielectric layer structure are composed of a first capacitor. The first plate, the third plate and a second portion of the inter-metal dielectric layer structure are composed of a second capacitor connected in series with the first capacitor.

25 Claims, 22 Drawing Sheets

$C = (C1 \times C2 \times C3)/(C1+C2+C3)$ $C = (C1 \times C2 \times C3 \times C4 \times C5)/(C1+C2+C3+C4+C5)$

GALVANICALLY-ISOLATED DEVICE AND METHOD FOR FABRICATING THE SAME

CROSS REFERENCE TO RELATED APPLICATIONS

This application claims the benefit of U.S. Provisional Applications No. 61/747,129, filed on Dec. 28, 2012, the entirety of which id incorporated by reference herein.

BACKGROUND OF THE INVENTION

1. Field of the Invention

The present invention relates to a galvanically-isolated device and a method for fabricating the same, and in particular to a design of a plate of a galvanically-isolated device and a method for fabricating the same.

2. Description of the Related Art

Any electrical system or power supply that includes systems that have different ground references or that have the capability to produce current surges requires the incorporation of galvanic isolation to protect both the system and the user. One kind of a conventional galvanic isolator is a capacitive isolator. The dielectric of the conventional capacitive isolator, however, requires great thickness and an enhanced isolation strength to endure the application of ultra-high voltage (for example, the transient voltage or operation voltage). Therefore, the conventional capacitive isolator has disadvantages of great stress and a huge volume.

Thus, a galvanically-isolated device is desired to solve the aforementioned problems.

BRIEF SUMMARY OF THE INVENTION

A galvanically-isolated device and a method for fabricating the same are provided. An exemplary embodiment of a galvanically-isolated device includes a lead frame including a first die-attach pad, a first lead and a second lead. A substrate is disposed on the first die-attach pad. A high-voltage semiconductor capacitor is formed on the substrate. The high-voltage semiconductor capacitor includes an interconnection structure. The interconnection structure includes an inter-metal dielectric layer structure. A first plate, a second plate and a third plate are formed on the inter-metal dielectric layer structure, separated from each other. The first plate, the second plate and a first portion of the inter-metal dielectric layer structure overlapping with both the first plate and the second plate are composed of a first capacitor. The first plate, the third plate and a second portion of the inter-metal dielectric layer structure overlapping with both the first plate and the third plate are composed of a second capacitor connected in series with the first capacitor. A first bonding wire is electrically connected between the second plate and the first lead. A second bonding wire is electrically connected between the third plate and the second lead. A molding compound layer encapsulates the high-voltage semiconductor capacitor, the first die-attach pad, the first bonding wire and the second bonding wire.

An exemplary embodiment of a method for fabricating a galvanically-isolated device includes providing the first electrical die. The galvanically-isolated device includes a lead frame including a first die-attach pad, a first lead and a second lead. A substrate is disposed on the first die-attach pad. A high-voltage semiconductor capacitor is formed on the substrate. The high-voltage semiconductor capacitor includes an interconnection structure. The interconnection structure includes an inter-metal dielectric layer structure. A first plate, a second plate and a third plate are formed on the inter-metal dielectric layer structure, separated from each other. The first plate, the second plate and a first portion of the inter-metal dielectric layer structure overlaps with both the first plate and the second plate are composed of a first capacitor. The first plate, the third plate and a second portion of the inter-metal dielectric layer structure overlapping with both the first plate and the third plate are composed of a second capacitor connected in series with the first capacitor. A first bonding wire is electrically connected between the second plate and the first lead. A second bonding wire is electrically connected between the third plate and the second lead. A molding compound layer encapsulates the high-voltage semiconductor capacitor, the first die-attach pad, the first bonding wire and the second bonding wire. A protective layer is formed of a material comprising polyimide is formed on the interconnection structure. The protective layer has two openings for the first and second bonding wires passing therethrough, respectively. The substrate and the high-voltage semiconductor capacitor are composed of a first electrical die. The first electrical die is disposed on the first die-attach pad of the lead frame. A wire bonding process is performed to electrically connect the second plate and the first lead by the first bonding wire and electrically connect the third plate and the second lead by the second bonding wire. The molding compound layer is formed encapsulating the third electrical die, the first die-attach pad, the first bonding wire and the second bonding wire.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
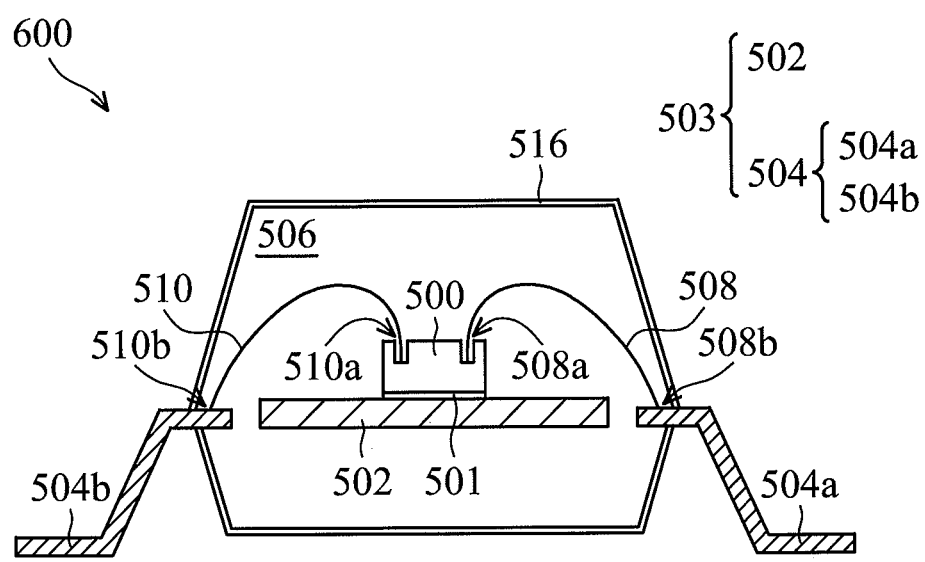
FIG. 1 is a schematic cross-sectional view of one embodiment of a galvanically-isolated device of the invention.

The following description is of the contemplated mode of carrying out the invention. This description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

FIG. 1 is a schematic cross-sectional view of one embodiment of a galvanically-isolated device 600 of the invention. In this embodiment, the galvanically-isolated device 600 may be a package using a wire bonding technology. Furthermore, the galvanically-isolated device 600 may be a high voltage capacitor package with a high breakdown voltage more than 5000V. As shown in FIG. 1, one embodiment of the galvanically-isolated device 600 includes a lead frame 503, an electrical die 500, two bonding wires 508 and 510, and a molding compound 506.

In one embodiment, the lead frame 503 includes a die-attach pad (DAP) (or paddle) 502 and a plurality of leads 504. Also, the die-attach pad 502 of the lead frame 503 is disposed in a central portion of the lead frame 503. As shown in FIG. 1, the electrical die 500 can be mounted on the central portion of the die-attach pad 502 by using the adhesive material 501, and the electrical die 500 may be electrically connected to the corresponding leads (or guiding pin) 504a and 504b of the lead frame 503 by the bonding wires 508 and 510, respectively. In one embodiment, the electrical die 500 serves as a high voltage capacitor chip 500.

As shown in FIG. 1, the electrical die 500 and the bonding wires 508 and 510 are encapsulated by the molding compound 506. In one embodiment, the molding compound 506 may be formed of molding materials such as resin. Therefore, the bonding wires 508 and 510 are spaced apart from each other through the molding compound 506 to avoid a short circuit phenomenon between each other.

As shown in FIG. 1, the galvanically-isolated device 600 may include an optional element, a mold cap 516. The mold cap 516 may be formed surrounding the die-attach pad 502, the electrical die 500, molding compound 506 and portions of the leads 504 of the lead frame 503. Some other portions of the leads 504 of the lead frame 503 are exposed. Also, the molding compound 506 fills the internal space of the mold cap 516.

Arrangements of various embodiments of electrical dies 500a-500d are illustrated through FIGS. 2A, 2B, 3A, 3B, 4A, 4B and 5. Various embodiments of the electrical dies 500a-500d are electrical dies fabricated by a wafer level process. Each of the electrical dies 500a-500d includes several capacitors connected in series. The capacitors are composed of a plurality of discrete plates (interconnection-level metal layer), which are arranged staggered on top and bottom surfaces of an inter-metal dielectric (IMD) layer structure of an interconnection structure, and the inter-metal dielectric (IMD) layer structure between the discrete plates. Also, a thickness of a dielectric of each of the capacitors is the same as a thickness of the IMD layer structure.

Further, a first plate of the electrical die is disposed on a surface of the IMD layer structure, which is electrically connected to the bonding wire, may overlap with a second plate disposed on an opposite surface of the IMD layer structure in a plan view in one embodiment. Moreover, an electrically floating plate disposed on a surface of the IMD layer structure may overlap with two plates disposed on an opposite surface of the IMD layer structure in a plan view in one embodiment. Therefore, a breakdown voltage of one embodiment of the electrical die (high voltage capacitor die) can be improve without increasing the thickness of the IMD layer structure.

Figure 2A:
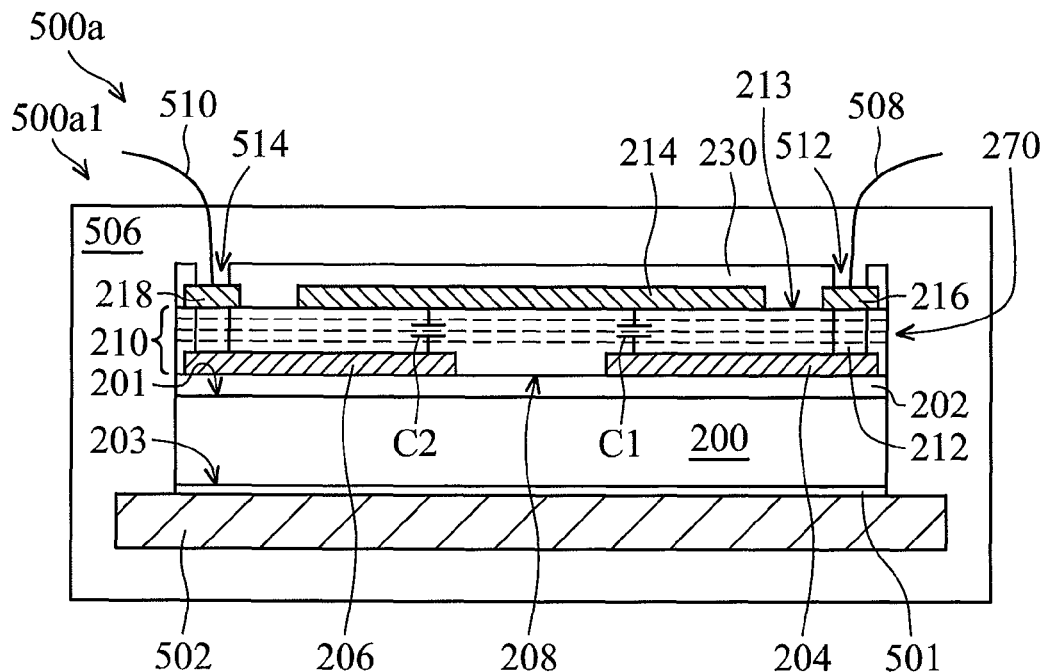
FIG. 2A is a schematic sectional view of a portion of one embodiment of a galvanically-isolated device of the present invention, showing an arrangement of one embodiment of an electrical die including a high-voltage semiconductor capacitor of the invention.
Figure 2B:
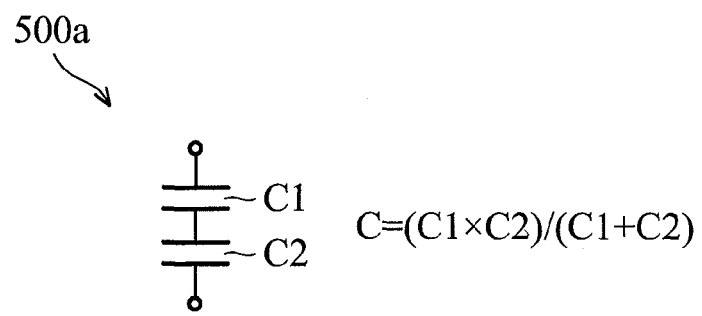
FIG. 2B is an equivalent circuit diagram of the electrical die as shown in FIG. 2A.

FIG. 2A is a schematic sectional view of a portion of one embodiment of a galvanically-isolated device of the present invention, showing an arrangement of one embodiment of an electrical die 500a including a high-voltage semiconductor capacitor 500a1 of the invention. FIG. 2B is an equivalent circuit diagram of the electrical die 500a as shown in FIG. 2A. Elements of the embodiments that are the same or similar as those previously described with reference to FIG. 1, are not repeated herein for brevity.

As shown in FIG. 2A, the electrical die 500a may include a substrate 200, a high-voltage semiconductor capacitor 500a1, a first bonding wire 508, a second bonding wire 510 and a molding compound layer 506. In one embodiment, the substrate 200 disposed on a die attached pad 502 may be a semiconductor substrate or an insulating substrate. In this embodiment, the substrate 200 serves as a semiconductor substrate 200.

In one embodiment, the high-voltage semiconductor capacitor 500a1 including an interconnection structure 270 is formed on the substrate 200 as shown in FIG. 2A. The interconnection structure 270 is formed on a top surface 201 of the substrate 200. In one embodiment as shown in FIG. 2A, the interconnection structure 270 includes a first plate interconnection-level metal layer) 214, an inter-metal dielectric (IMD) layer structure 210, a second plate (interconnection-level metal layer) 204 and a third plate (interconnection-level metal layer) 206. In one embodiment, the IMD layer structure 210 may be a single layer structure or a multi-layer structure, wherein the material of IMD layer structure 210 include, but are not limited to, silicon nitride, silicon oxide, oxygen nitride, polyimide or any combinations thereof.

In one embodiment, the first plate 214 is formed on a top surface 213 of the IMD layer structure 210 as shown in FIG. 2A. Further, the second plate 204 and the third plate 206 are formed on a bottom surface 208 of the IMD layer structure 210. The second plate 204 and the third plate 206 are spaced apart from each other. In one embodiment, the first plate 214 is a topmost interconnection-level metal layer (Mtop). Also, the second plate 204 and the third plate 206 are interconnection-level metal layers beneath the topmost interconnection-level metal layer (for example, a 1$^{st}$ metal layer (M1)). Also, the first metal layer pattern 214 is designed to overlap with both the second plate 204 and the third plate 206 in the plan view. The second plate 204 and the third plate 206 are electrically connected to the bonding wires 508 and 510 through via-plug lamination structures 212 and bonding pads 216 and 218 on the via-plug lamination structures 212, respectively. As shown in FIG. 2A, the first plate 214, the second plate 204 and a first portion of the IMD layer structure 210 overlapping with both the first plate 214 and the second plate 204 are composed of a first capacitor C1. Also, the first plate 214, the third plate 206 and a second portion of the IMD layer structure 210 overlapping with both the first plate 214 and the third plate 206 are composed of a second capacitor C2 connected in series with the first capacitor C1.

Therefore, as shown in FIG. 2B, a total capacitance value C of the electrical die 500a is equivalent to connecting a capacitance value of the capacitor C1 and a capacitance value of the capacitor C2 in series. The total capacitance value C is equal to (C1*C2)/(C1+C2).

In one embodiment, the high-voltage semiconductor capacitor 500a1 further includes a protective layer (protective layer structure) 230 formed on the interconnection structure 270. The protective layer 230 is formed of a material comprising polyimide as shown in FIG. 2A. In one embodiment, the protective layer 230 has two openings 512, 514 for first and second bonding wires 508, 510 passing therethrough, respectively. As shown in FIG. 2A, the first bonding wire 508 is electrically connected between the second plate 204 and a lead of the lead frame (for example, the first lead 204a of the lead frame 503 as shown in FIG. 1) through the via-plug lamination structures 212 and the bonding pads 216. Also, a second bonding wire 510 is electrically connected between the third plate 206 and another lead of the lead frame (for example, the second lead 204b of the lead frame 503 as shown in FIG. 1) through the via-plug lamination structures 212 and the bonding pad 218. A molding compound layer 506 encapsulates the high-voltage semiconductor capacitor 500d1, the die-attach pad 502, the first bonding wire 508 and the second bonding wire 510.

Figure 3A:
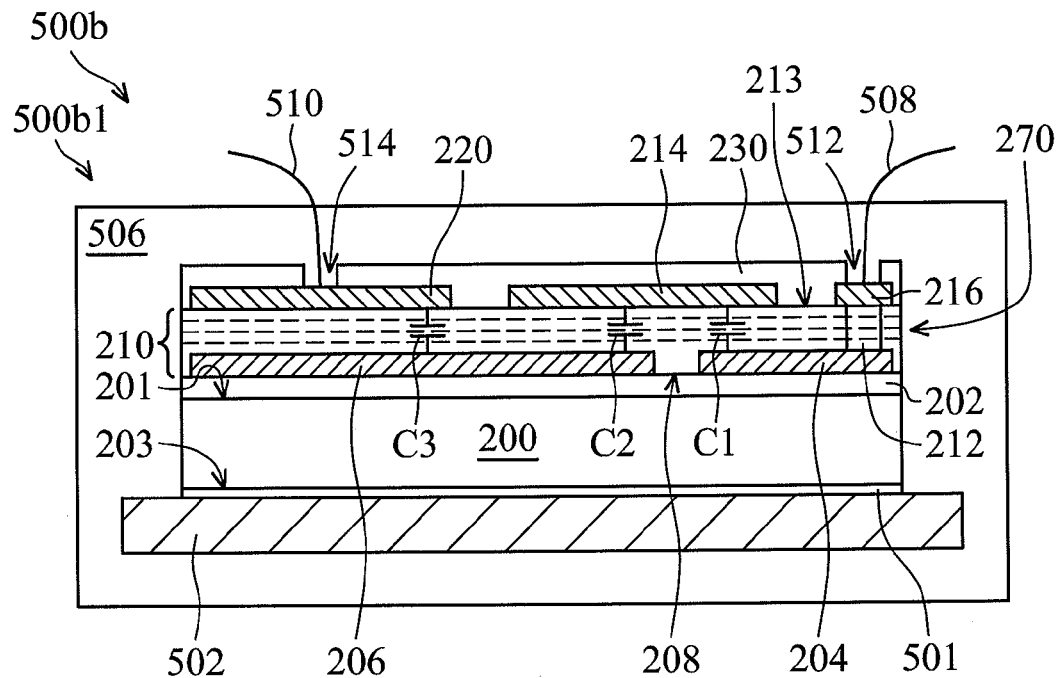
FIG. 3A is a schematic sectional view of a portion of another embodiment of a galvanically-isolated device of the present invention, showing an arrangement of another embodiment of an electrical die including a high-voltage semiconductor capacitor of the invention.
Figure 3B:
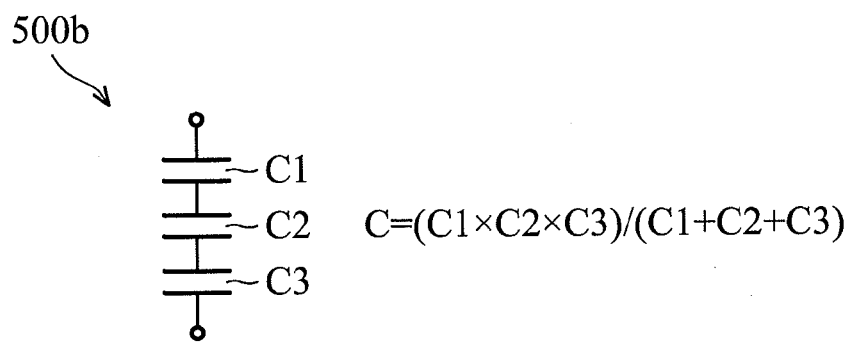
FIG. 3B is an equivalent circuit diagram of the electrical die as shown in FIG. 3A.

FIG. 3A is a schematic sectional view of a portion of another embodiment of a galvanically-isolated device of the present invention, showing an arrangement of another embodiment of an electrical die 500b including a high-voltage semiconductor capacitor 500b1 of the invention. FIG. 3B is an equivalent circuit diagram of the electrical die 500b as shown in FIG. 3A. Elements of the embodiments that are the same or similar as those previously described with reference to FIGS. 2A and 2B, are not repeated herein for brevity. One of differences between the electrical dies 500a and 500b is that an interconnection structure 270 of the electrical die 500b further includes a fourth plate 220 disposed on the top surface 213 of the IMD layer structure 210. In this embodiment, the fourth plate 220 is designed at an interconnection metal-layered level the same to the first plate 214. The fourth plate 220 and the first plate 214 are separated from each other. Also, the fourth plate 220 is designed to be overlapping with the third plate 206 in the plan view. As shown in FIG. 3A, the first plate 214, the second plate 204 and a first portion of the IMD layer structure 210 overlapping with both the first plate 214 and the second plate 204 are composed of a first capacitor C1. Also, the first plate 214, the third plate 206 and a second portion of the IMD layer structure 210 overlapping with both the first plate 214 and the third plate 206 are composed of a second capacitor C2. Further, the third plate 206, the fourth plate 220 and a third portion of the IMD layer structure 210 overlapping with both the third plate 206 and the fourth plate 220 are composed of a third capacitor C3. The first capacitor C1, the second capacitor C2 and the third capacitor C3 are connected in series.

As shown in FIG. 3B, a total capacitance value C of the electrical die 500b is equivalent to connecting a capacitance value of the capacitor C1, a capacitance value of the capacitor C2 and a capacitance value of the capacitor C3 in series. The total capacitance value C is equal to (C1*C2*C3)/(C1+C2+C3).

Figure 4A:
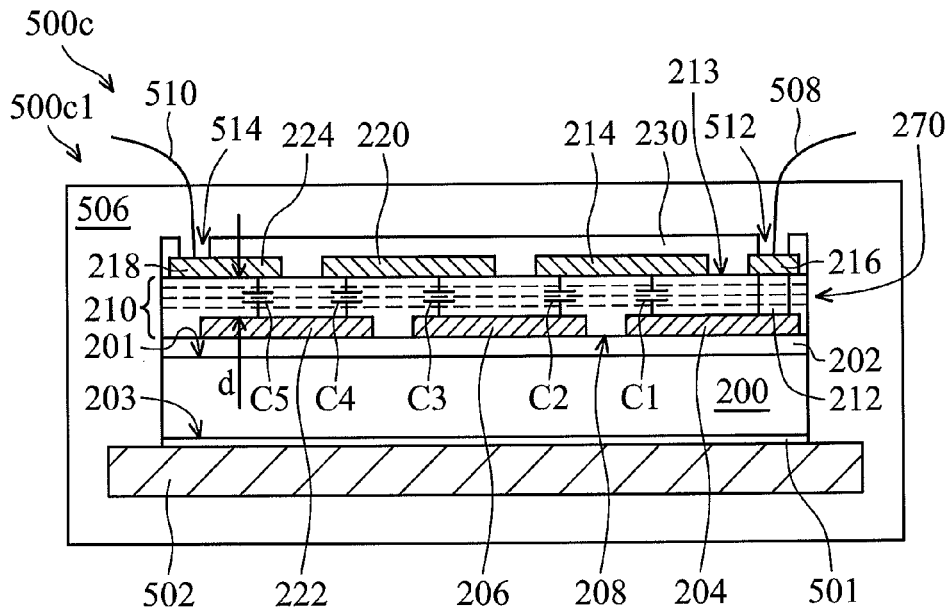
FIG. 4A is a schematic sectional view of a portion of yet another embodiment of a galvanically-isolated device of the present invention, showing an arrangement of yet another embodiment of an electrical die including a high-voltage semiconductor capacitor of the invention.
Figure 4B:
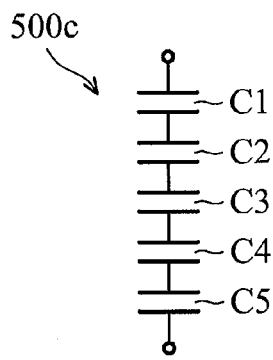
FIG. 4B is an equivalent circuit diagram of the electrical die as shown in FIG. 4A.

FIG. 4A is a schematic sectional view of a portion of yet another embodiment of a galvanically-isolated device of the present invention, showing an arrangement of yet another embodiment of an electrical die 500c including a high-voltage semiconductor capacitor 500c1 of the invention. FIG. 4B is an equivalent circuit diagram of the electrical die 500c as shown in FIG. 4A. Elements of the embodiments that are the same or similar as those previously described with reference to FIGS. 2A, 2B, 3A and 3B, are not repeated herein for brevity. One of differences between the electrical dies 500d and 500c is that an interconnection structure 270 of the electrical die 500c further includes a fifth plate 224 and a sixth plate 222. As shown in FIG. 4A, the first plate 214, the fourth plate 220 and the fifth plate 224 are disposed on the top surface 213 of the IMD layer structure 210. Also, the second plate 204, the third plate 206 and the sixth plate 222 are disposed on the bottom surface 208 of the IMD layer structure 210. In this embodiment, the first plate 214, the fourth plate 220 and the fifth plate 224 are designed at the same interconnection metal-layered level. Also, the second plate 204, the third plate 206 and the sixth plate 222 are designed at the same interconnection metal-layered level. Also, the sixth plate 222 is designed to be overlapping with both the fourth plate 220 and the fifth plate 224 in the plan view. As shown in FIG. 4A, the first plate 214, the second plate 204 and a first portion of the IMD layer structure 210 overlapping with both the first plate 214 and the second plate 204 are composed of a first capacitor C1. Also, the first plate 214, the third plate 206 and a second portion of the IMD layer structure 210 overlapping with both the first plate 214 and the third plate 206 are composed of a second capacitor C2. Further, the third plate 206, the fourth plate 220 and a third portion of the IMD layer structure 210 overlapping with both the third plate 206 and the fourth plate 220 are composed of a third capacitor C3. Moreover, the fourth plate 220, the sixth plate 222 and a fourth portion of the IMD layer structure 210 overlapping with both the fourth plate 220 and the sixth plate 222 are composed of a fourth capacitor C4. The sixth plate 222, the fifth plate 224 and a fifth portion of the IMD layer structure 210 overlapping with both the sixth plate 222 and the fifth plate 224 are composed of a fifth capacitor C5. The first capacitor C1, the second capacitor C2, the third capacitor C3, the fourth capacitor C4 and the fifth capacitor C5 are connected in series.

As shown in FIG. 4B, a total capacitance value C of the electrical die 500c is equivalent to connecting capacitance values of the capacitor C1, the capacitor C2, the capacitor C3, the capacitor C4 and the capacitor C5 in series. The total capacitance value C is equal to (C1*C2*C3*C4*C5)/(C1+C2+C3+C4+C5).

Figure 5:
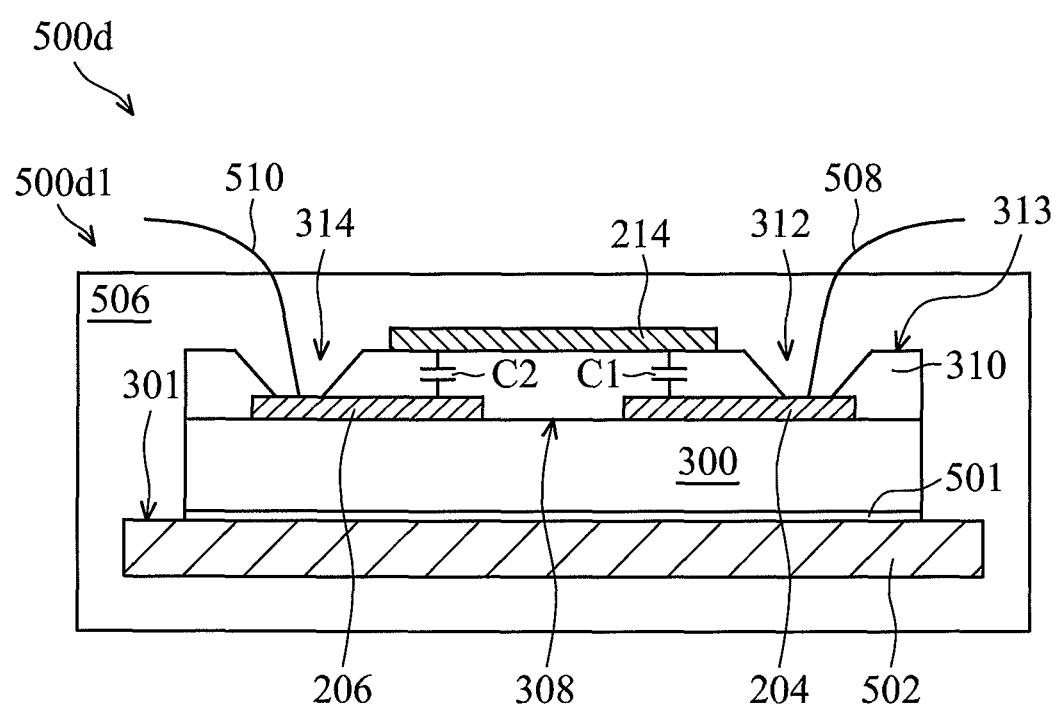
FIG. 5 is a schematic sectional view of a portion of still another embodiment of a galvanically-isolated device of the present invention, showing an arrangement of still another embodiment of an electrical die including a high-voltage semiconductor capacitor of the invention.

FIG. 5 is a schematic sectional view of a portion of still another embodiment of a galvanically-isolated device of the present invention, showing an arrangement of still another embodiment of an electrical die 500d including a high-voltage semiconductor capacitor 500d1 of the invention. Elements of the embodiments that are the same or similar as those previously described with reference to FIGS. 2A, 2B, 3A, 3B, 4A and 4B, are not repeated herein for brevity. In this embodiment, the high-voltage semiconductor capacitor 500d1 is the electrical die 500d is disposed on a nonconductive substrate 300, for example, a glass wafer. An IMD layer structure 310 may be a polymer layer.

As shown in FIG. 5, a high-voltage semiconductor capacitor 500d1 of the electrical die 500d is formed on the nonconductive substrate 300 disposed on the first die-attach pad 502. In one embodiment, the high-voltage semiconductor capacitor 500d1 includes an interconnection structure including an inter metal dielectric (IMD) layer structure 310, a first plate 214, a second plate 204 and a third plate 206 on the IMD layer structure 310. The first plate 214, the second plate 204 and the third plate 206 are separated from each other. The first plate 214, the second plate 204 and a first portion of the IMD layer structure 310 overlapping with both the first plate 214 and the second plate 204 are composed of a first capacitor C1. Also, the first plate 214, the third plate 206 and a second portion of the IMD layer structure 310 overlapping with both the first plate 214 and the third plate 206 are composed of a second capacitor C2 connected in series with the first capacitor C1. Therefore, as shown in FIG. 5, a total capacitance value C of the electrical die 500d is equivalent to connecting a capacitance value of the capacitor C1 series and a capacitance value of the capacitor C2 in series. The total capacitance value C is equal to (C1*C2)/(C1+C2).

As shown in FIG. 5, a first bonding wire 508 is electrically connected between the second plate 204 and a lead of the lead frame (for example, the first lead 204a of the lead frame 503 as shown in FIG. 1). Also, a second bonding wire 510 is electrically connected between the third plate 206 and another lead of the lead frame (for example, the second lead 204b of the lead frame 503 as shown in FIG. 1). A molding compound layer 506 encapsulates the high-voltage semiconductor capacitor 500d1, the die-attach pad 502, the first bonding wire 508 and the second bonding wire 510.

In one embodiment, the first plate 214 is a topmost interconnection-level metal layer of the IMD layer structure 310. The second plate 204 and the third plate 206 are interconnection-level metal layers beneath the topmost interconnection-level metal layer of the IMD layer structure 310 as shown in FIG. 5.

In one embodiment of the present invention, the electrical dies 500a-500d with only two or more capacitors are connected in series. The electrical dies 500a-500d have no other components or integrated electronic circuits within. In one embodiment, however, the electrical dies 500a-500d may be integrated with other electronic components or integrated circuits within, for example, sensing elements. The high-voltage semiconductor capacitors, electronic components and integrated circuits of the electrical dies 500a-500d may be fabricated by a wafer level manufacturing process.

Figure 9:
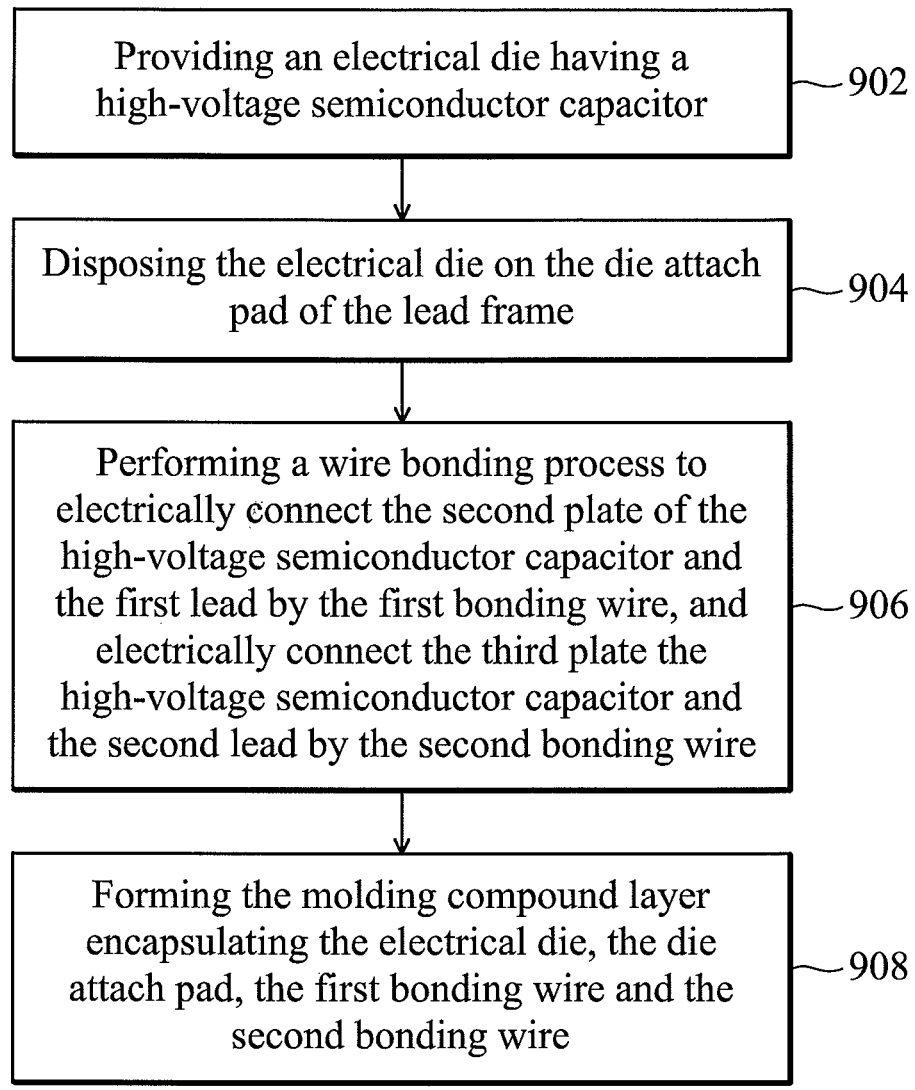
FIG. 9 is a flowchart of one embodiment of a method for fabricating a galvanically-isolated device of the invention.

FIG. 9 is a flowchart of one embodiment of a method for fabricating a galvanically-isolated device of the invention. First, in operation 902, one of electrical dies 500, 500a, 500b, 500c or 500d having a high-voltage semiconductor capacitor (high-voltage semiconductor capacitor 500, 500a1-500d1) as shown in FIG. 1, 2A, 2B, 3A, 3B, 4A or 4B is provided. Afterwards, in operation 904, the electrical die is disposed on the die-attach pad 502 of the lead frame 503 as shown in FIG. 1. Afterwards, in operation 906, a wire bonding process is performed to electrically connect the second plate 204 and the lead 504a by the first bonding wire 508 and electrically connect the third plate 206 and the lead 504b by the second bonding wire 510 as shown in FIGS. 1, 2A, 2B, 3A, 3B, 4A and 4B. Afterwards, in operation 908, the molding compound layer 506 is formed encapsulating the third electrical die 500, the die-attach pad 502, the first bonding wire 508 and the second bonding wire 510 as shown in FIG. 1.

Figure 6A:
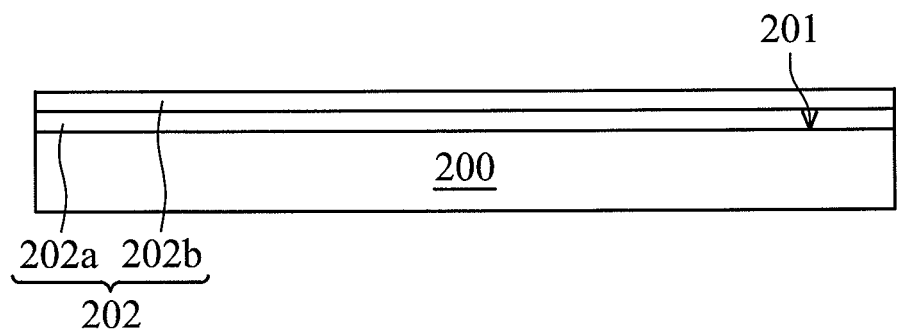
FIGS. 6A-6H are cross-sectional schematic diagrams showing intermediate stages of one embodiment of a method for fabricating an electrical die of a galvanically-isolated device of the invention.

Next, FIGS. 6A-6H, 7A-7L, 8A-8G are used to describe the operation 902, 904 as shown in FIG. 9 of one embodiment of a method for fabricating a galvanically-isolated device. FIGS. 6A-6H are cross-sectional schematic diagrams showing intermediate stages of one embodiment of a method for fabricating an electrical die 500e of a galvanically-isolated device of the invention. In this embodiment, the electrical die 500e is a high-voltage semiconductor capacitor die having a sealing ring structure. Also, the electrical die 500e is fabricated using a semiconductor substrate such as a silicon (Si) substrate. The seal ring structure can protect the internal capacitor to isolate from the moisture or chemical pollution in the outside environment and external stress damage. As shown in FIG. 6A, a substrate 200 is provided, and the substrate 200 may be, for example, a silicon substrate. Next, dielectric layers 202a, 202b are formed on a top surface 201 of the substrate 200 in sequence. The dielectric layers 202a, 202b may be formed by a thin film deposition method including chemical vapor deposition (CVD), atomic layer deposition (ALD), other suitable thin film deposition methods or combinations thereof. In one embodiment, the dielectric layers 202a and 202b may be a portion of an interlayer dielectric (ILD) structure 202.

Figure 6B:
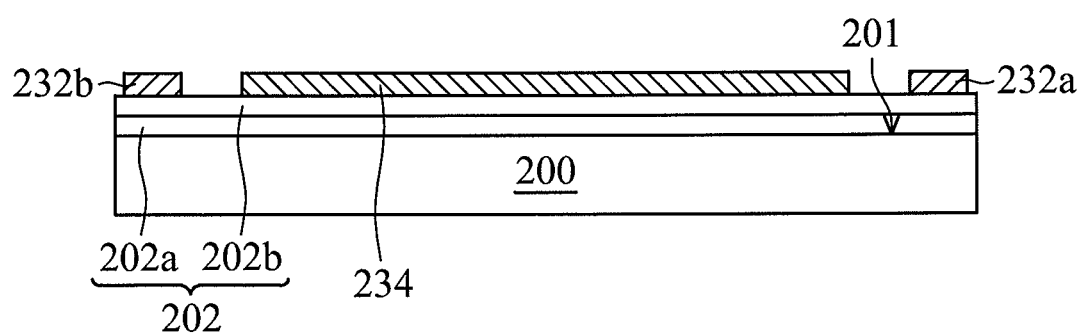

Next, please refer to FIG. 6B, a metal layer (not shown) is formed on the ILD structure 202 by a thin film deposition method including physical vapor deposition (PVD), atomic layer deposition (ALD), other suitable thin film deposition methods or combinations thereof. Next, a patterning process including a photolithography process including and an anisotropic etching process are performed to remove portions of the metal layer to form a metal layer pattern 234 on the top surface 201 of the substrate 200. Also, the metal layer patterns 232a, 232b are formed close to opposite sides of the metal layer pattern 234. In one embodiment, the metal layer patterns 234, 232a and 232b are formed at the same interconnection metal-layered level.

Figure 6C:
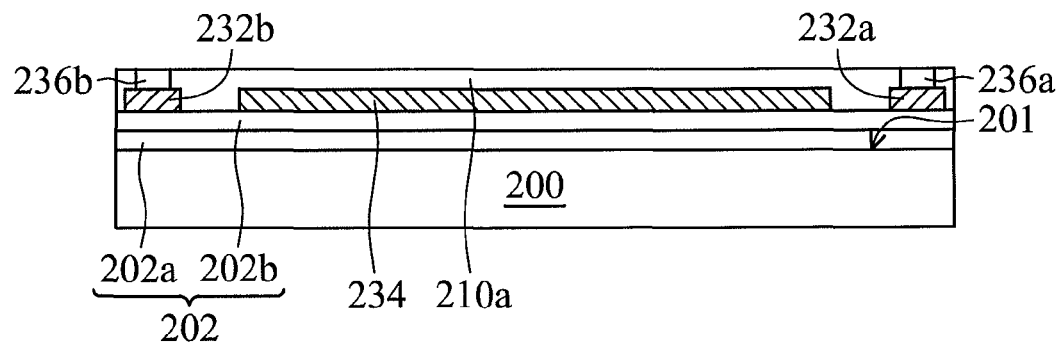

Next, please reference to FIG. 6C, a dielectric layer 210a is formed on the interlayer dielectric layer (ILD) structure 202 by a thin film deposition method including chemical vapor deposition (CVD), atomic layer deposition (ALD), other suitable thin film deposition methods or combinations thereof. The dielectric layer 210a also covers the metal layer patterns 234, 232a and 232b. Next, a patterning process including a photolithography process including an anisotropic etching process are performed to portions of the dielectric layer 210a over the metal layer patterns 232a and 232b to form openings (not shown) through the dielectric layer 210a on the metal layer patterns 232a and 232b. Next, a barrier layer (not shown), which includes, for example, titanium (Ti), titanium nitride (TiN), or combinations thereof, is formed on a sidewall of the openings. Next, a conductive material, which includes, for example, tungsten (W) or polysilicon, is filled into the openings to form via plugs 236a and 236b. The via plugs 236a and 236b are connected to the metal layer patterns 232a and 232b respectively.

Figure 6D:
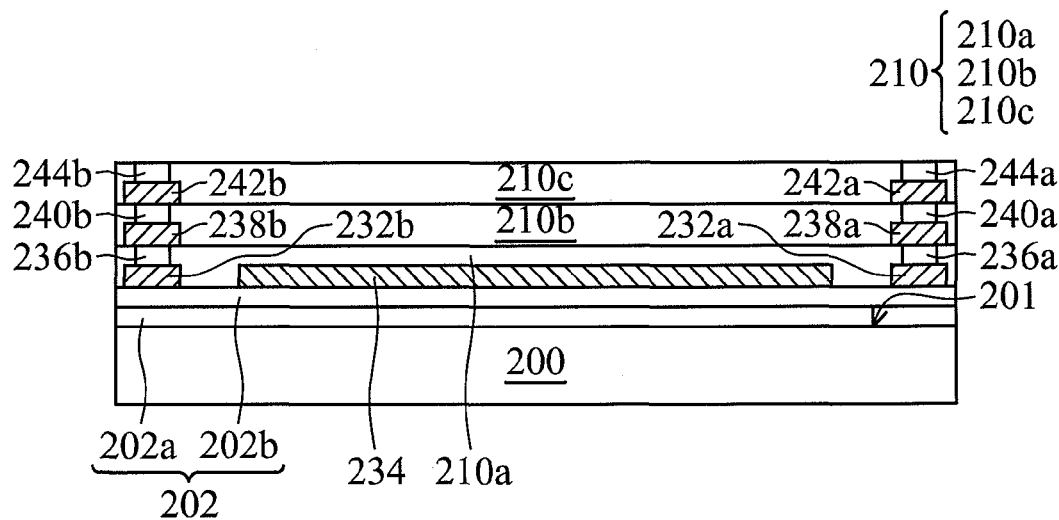

Next, please refer to FIG. 6D, the processes for forming the metal layer patterns, the dielectric layer and the via plugs as shown in FIGS. 6B, 6C are repeated to form dielectric layers 210b, 210c on the via plugs 236a and 236b, metal layer patterns 238a and 238b covered by the dielectric layer 210b, metal layer patterns 242a and 242b covered by the dielectric layer 210c, via plugs 240a and 240b through the dielectric layer 210b, and via plugs 244a and 244b through the dielectric layer 210c. It is noted that there is no metal layer pattern is formed directly on the metal layer pattern 234, covered by the dielectric layers 210b, 210c. As shown in FIG. 6D, the metal layer patterns 238a and 238b are respectively connected to the via plugs 236a and 236b. The via plugs 240a and 240b are respectively connected to the metal layer patterns 238a and 238b. Also, the metal layer patterns 242a and 242b are respectively connected to the via plugs 240a and 240b. The via plugs 244a and 244b are respectively connected to the metal layer patterns 242a and 242b.

Figure 6E:
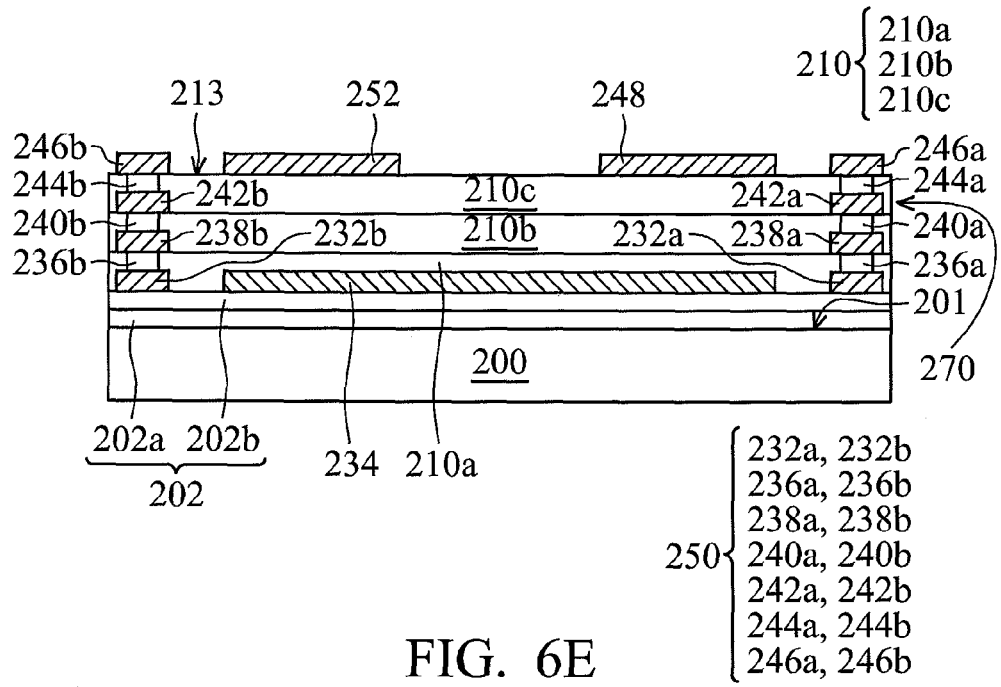

Next, please refer to FIG. 6E, the patterning process as shown in FIG. 6B is repeated to form metal layer patterns 246a, 246b, 248 and 252 on the dielectric layer 210c. The metal layer patterns 246a, 246b, 248 and 252 are separated from each other. In this embodiment, the metal layer patterns 246a and 246b are respectively connected to the via plugs 244a and 244b. Also, the metal layer patterns 248 and 252 are designed to be overlapping with the metal layer pattern 234. In this embodiment, a plan view area of the metal layer pattern 234 is designed to be larger than that of the metal layer patterns 248 or 252. Therefore, the metal layer pattern 234 may overlap with the metal layer patterns 248 and 252. In one embodiment as shown in FIG. 6E, the vertically laminated dielectric layers 210a, 210b and 210c are composed of an inter-metal dielectric (IMD) layer structure 210. In addition, the IMD layer structure 210, the metal layer patterns 234, 232a, 232b, 238a, 238b, 242a, 246b, 246a, 248 and 252, and the via plugs 236a, 236b, 240a, 240b, 244a and 244b are composed of an interconnection 270 of the electrical die 500e. Also, the dielectric layers 210a, 210b and 210c of the IMD layer structure 210 may serve as IMD layers of the interconnection 270. The metal layer patterns 234, 232a, 232b, 238a, 238b, 242a, 242b, 246a, 246b, 248 and 252 may serve as metal layers at various interconnection metal-layered levels of the interconnection 270. The via plugs 236a, 236b, 240a, 240b, 244a and 244b may serve as via plugs at various interconnection via plug levels of the interconnection structure 270. In some embodiments, the number of metal layer patterns and the number of via plugs are not limited but can vary according to designs.

As shown in FIG. 6E, a seal ring structure 250 is formed in the IMD layer structure 210 during the formation of the interconnection structure 270. The seal ring structure 250 is formed surrounding the metal layer patterns 234, 248 and 252. In this embodiment, the seal ring structure 250 is composed by the via plugs 236a, 236b, 240a, 240b, 244a and 244b, which are respectively formed through the dielectric layers 210a, 210b and 210c, and the metal layer patterns 232a, 232b, 238a, 238b, 242a, 242b, 246a, 246b, which are alternatively laminating with the dielectric layers 210a, 210b and 210c. The via plugs 236a, 236b, 240a, 240b, 244a and 244b, and the metal layer patterns 232a, 232b, 238a, 238b, 242a, 242b, 246a, 246b are vertically laminated and interconnected to each other. In alternatively embodiments, the number of metal layer patterns and the number of via plugs are not limited but can vary according to the number of layers in the interconnection structure.

Figure 6F:
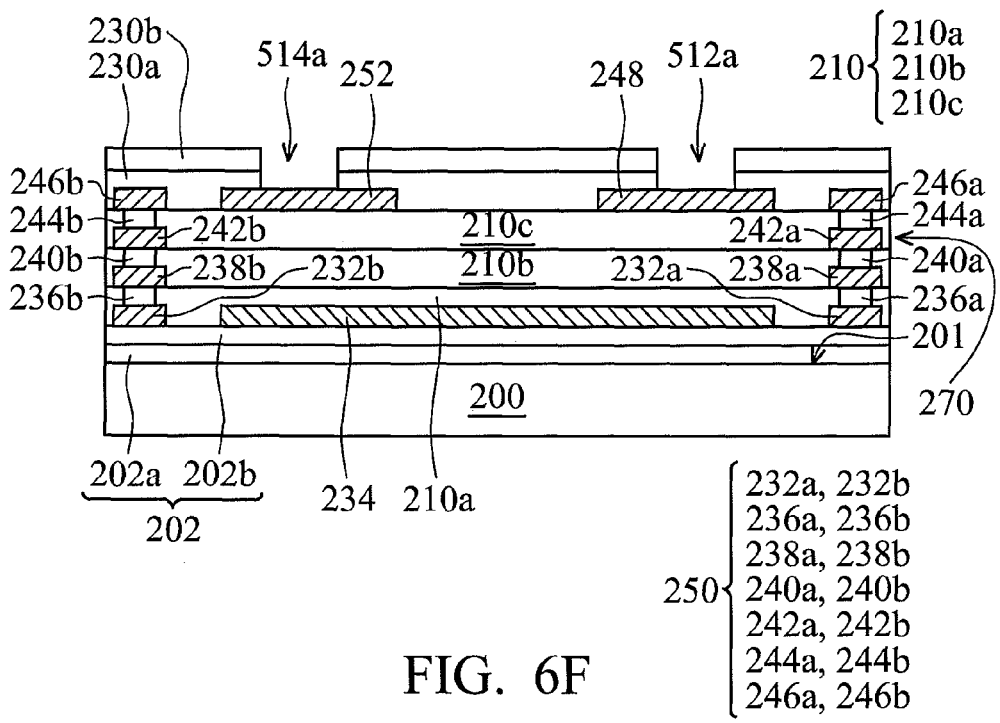
Figure 6G:
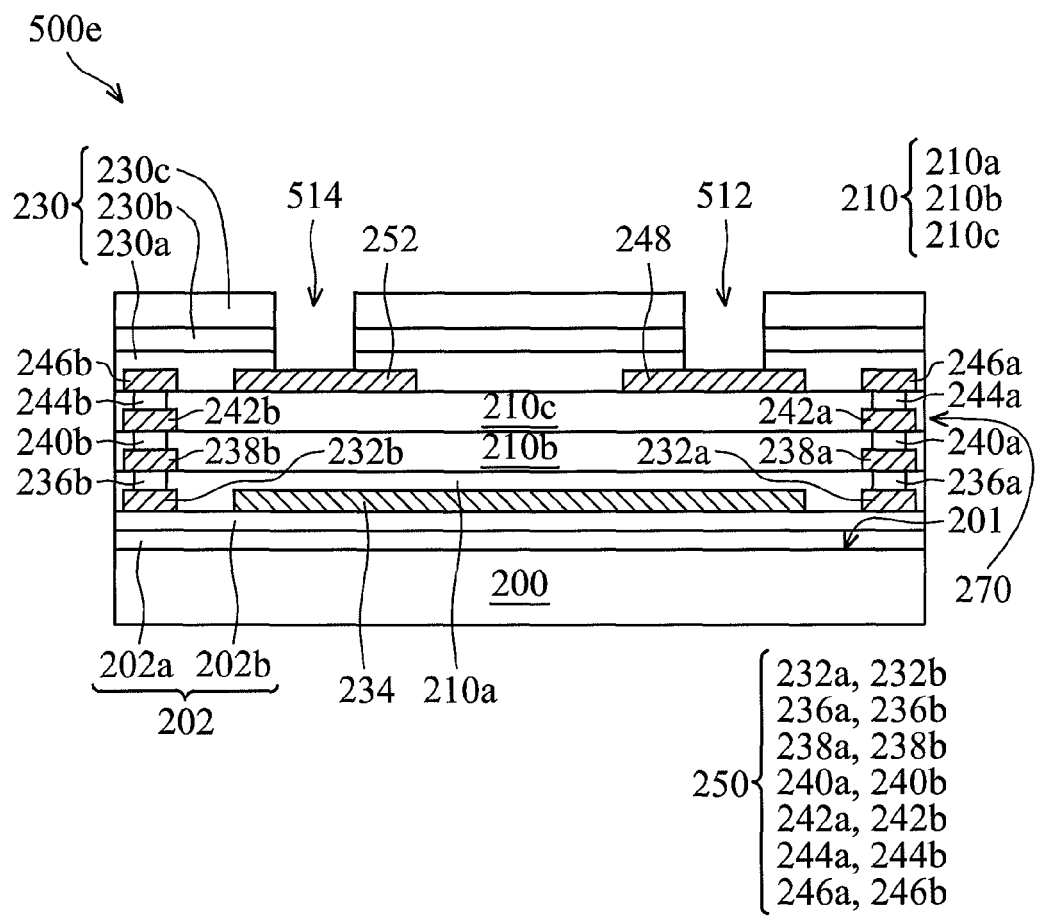

FIGS. 6F and 6G illustrate a formation of a protective (protection) layer (or a protective structure). The protective layer covers a top surface of the interconnection structure 270 to protect the underlying internal capacitor to isolate it from the moisture or chemical pollution in the outside environment and external stress damage.

Next, please refer to FIG. 6F, protective layers 230a and 230b are formed on the interconnection structure 270 in sequence, covering the IMD layer structure 210 and the metal layer patterns 246a, 246b, 248 and 252. In one embodiment, the protective layers 230a and 230b may be formed of materials that are the same or different from each other. In this embodiment, the protective layer 230a may be formed by silicon oxide. The protective layer 230b may be formed by silicon nitride. Next, a patterning process including a photolithography process including and an anisotropic etching process is performed to remove portions of the protective layers 230a and 230b to form openings 512a and 514a through the protective layers 230a and 230b. The openings 512a and 514a are formed over the metal layer patterns 248 and 252. The openings 512a and 514a define wire bonding locations of subsequent bonding wires.

Next, please refer to FIG. 6G, a protective layer 230c is formed on the protective layers 230a and 230b. In this embodiment, the protective layer 230c is formed of polyimide. Next, a patterning process including a photolithography process including and an anisotropic etching process is performed to remove portions of the protective layer 230c to form openings 512 and 514 through the protective layers 230a, 230b and 230c. The openings 512 and 514 are formed over the metal layer patterns 248 and 252. The openings 512 and 514 define wire bonding locations of subsequent bonding wires. In one embodiment, the protective layers 230a, 230b and 230c are composed of a protective layer (protective layer structure) 230. In one embodiment, the protective layer 230 is formed by a redistribution layer (RDL) process. After performing the aforementioned processes, one embodiment of the electrical die 500e of a galvanically-isolated device is completely fabricated.

Figure 6H:
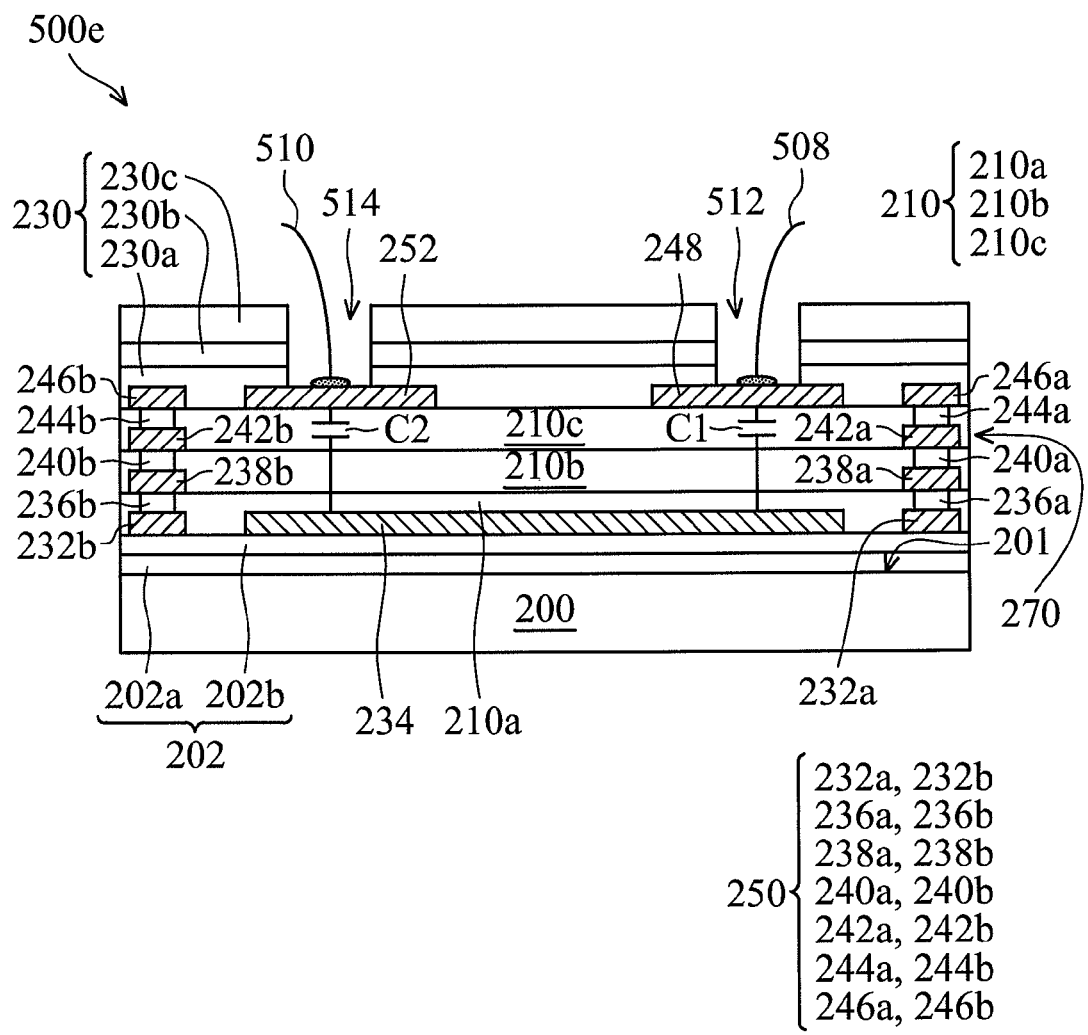

Next, please refer to FIG. 6H, a wire bonding process is processed to bond the bonding wires 508 and 510 onto the metal layer patterns 248 and 252 by respectively passing through the openings 512 and 514 of the protective layer 230. In this embodiment, the IMD layer structure 210 and the metal layer patterns 234, 248 and 252 are composed of two capacitors connected in series. As shown in FIG. 6H, the metal layer pattern (first plate) 234, the metal layer pattern (second plate) 248 and a first portion of the IMD layer structure 210 overlapping with both the metal layer patterns 234 and 248 are composed of a first capacitor C1. Also, the metal layer pattern (first plate) 234, the metal layer pattern (third plate) 252 and a second portion of the IMD layer structure 210 overlapping with both the metal layer patterns 234 and 252 are composed of a second capacitor C2 connected in series with the first capacitor C1. In this embodiment, the metal layer pattern (first plate) 234 is a bottommost interconnection-level metal layer (for example, a $1^{st}$ metal layer (M1)). Also, the metal layer pattern (second plate) 248 and the metal layer pattern (third plate) are interconnection-level metal layers above the bottommost interconnection-level metal layer (for example, topmost metal layers (Mtop)). Alternatively, a layered-level of the metal layer patter 234 and a layered-level of the metal layer patterns 248 and 252 can be exchanged, thereby forming a high-voltage capacitor structure similarly to FIG. 2A. Also, the metal layer patterns 248 and 252 may be electrically connected to the bonding wires 508 and 510 by a via-plug lamination structures formed through an IMD layer structure (the via-plug lamination structures 212 as shown in FIG. 2A) and bonding pads (the bonding pads 216 as shown in FIG. 2A) on the via-plug lamination structures.

Figure 7A:
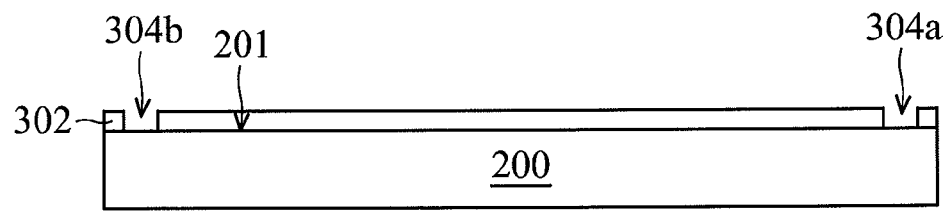
FIGS. 7A-7K are cross-sectional schematic diagrams showing intermediate stages of another embodiment of a method for fabricating an electrical die of a galvanically-isolated device of the invention.

FIGS. 7A-7K are cross-sectional schematic diagrams showing intermediate stages of another embodiment of a method for fabricating an electrical die 500f of a galvanically-isolated device of the invention. Elements of the embodiments that are the same or similar as those previously described with reference to FIGS. 6A-6H, are not repeated herein for brevity. In this embodiment, the electrical die 500f is a high-voltage semiconductor capacitor die having a sealing ring structure. Also, the electrical die 500f is fabricated using a semiconductor substrate such as a silicon (Si) substrate. The seal ring structure can protect the internal capacitor to isolate from the moisture or chemical pollution in the outside environment and external stress damage. As shown in FIG. 7A, a substrate 200 is provided, and the substrate 200 may be, for example, a silicon substrate. Next, a dielectric layer 302 is formed on a top surface 201 of the substrate 200. Next, openings 304a and 304b are formed through the dielectric layer 302. In one embodiment, the dielectric layer 302 is a portion of the interlayer dielectric (ILD) layer. The openings 304a and 304b may be close to an edge of the substrate 200.

Figure 7B:
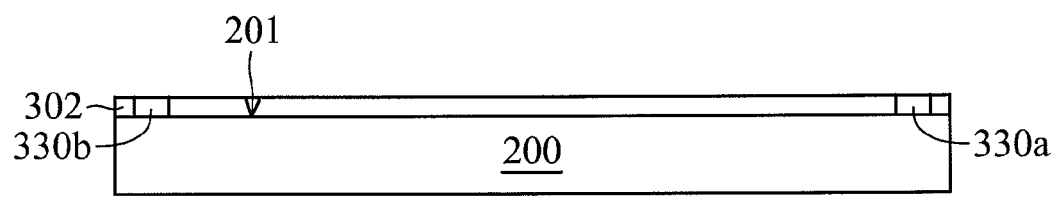
Figure 7C:
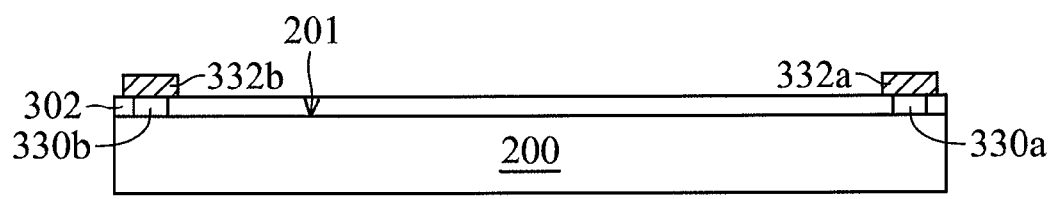
Figure 7D:
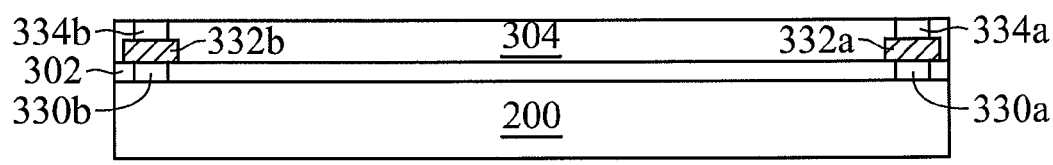

Next, as shown in FIG. 7B, processes similar to the processes as shown in FIG. 6C may be performed to form via plugs 330a and 330b in the openings 304a and 304b. Next, as shown in FIGS. 7C and 7D, processes for forming metal layer patterns, dielectric layers and via plugs similar to the processes as shown in FIGS. 6B and 6C may be performed to form a dielectric layer 304 on the via plugs 330a and 330b, metal layer patterns 332a and 332b covered by the dielectric layer 304, and via plugs 334a and 334b through the dielectric layer 304. In this embodiment, the dielectric layer 304 may be an inter-metal dielectric (IMD) layer.

Figure 7E:
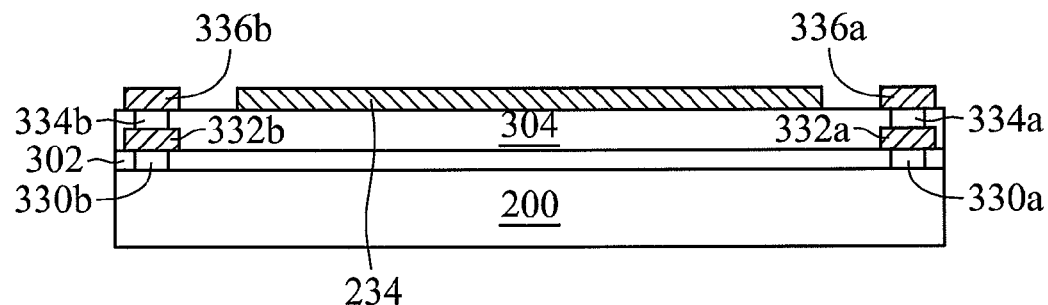

Next, as shown in FIG. 7E, a metal layer pattern 234 is formed on the dielectric layer 304. Also, the metal layer patterns 336a, 336b are formed close to opposite side of the metal layer pattern 234. In one embodiment, the metal layer patterns 234, 336a and 336b are formed at the same interconnection metal-layered level. In this embodiment, the metal layer patterns 234, 336a and 336b are $2^{nd}$ interconnection-level metal layers (M2).

Figure 7F:
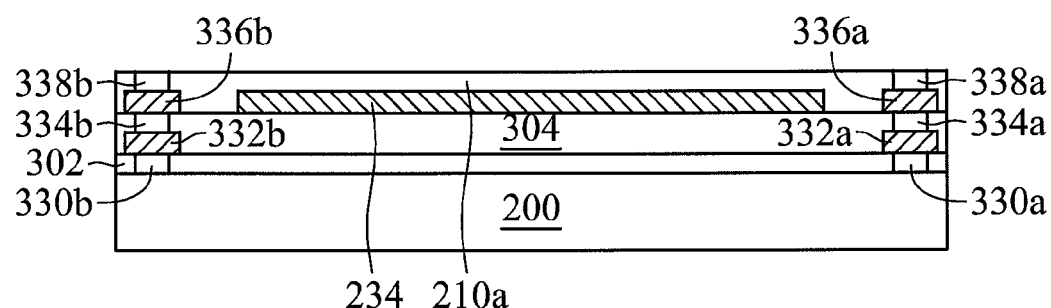
Figure 7G:
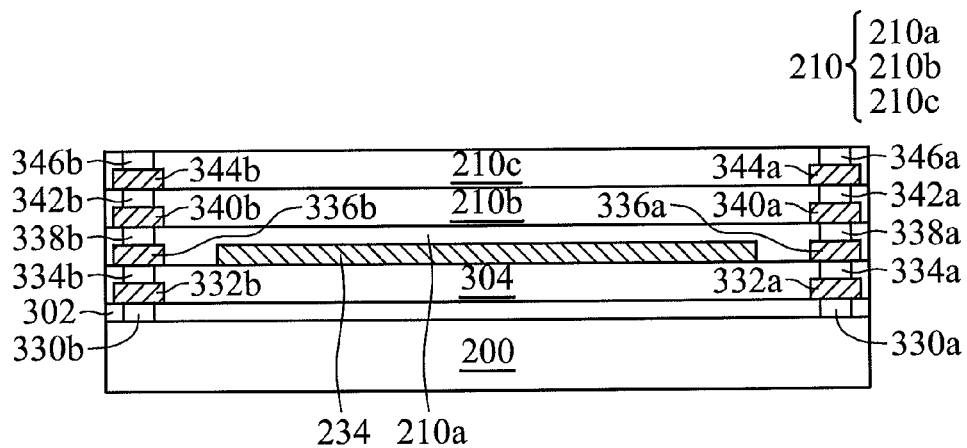

Next, as shown in FIGS. 7F and 7G, processes for forming the metal layer patterns, the dielectric layer and the via plugs similar to the processes as shown in FIGS. 6B, 6C are performed to form dielectric layers 210a, 210b, 210c on the metal layer patterns 234, 336a and 336b, metal layer patterns 340a and 340b covered by the dielectric layer 210b, metal layer patterns 344a and 344b covered by the dielectric layer 210c, via plugs 342a and 342b through the dielectric layer 210b, and via plugs 346a and 346b through the dielectric layer 210c. It is noted that there is no metal layer pattern is formed directly on the metal layer pattern 234, covered by the dielectric layers 210a, 210b, 210c. As shown in FIG. 7G, the via plugs 338a and 338b are respectively connected to the underlying metal layer patterns 336a and 336b and the overlying metal layer patterns 340a and 340b. The via plugs 342a and 342b are respectively connected to the underlying metal layer patterns 340a and 340b and the overlying metal layer patterns 344a and 344b. Also, the metal layer patterns 344a and 344b are respectively connected to the overlying via plugs 346a and 346b.

Figure 7H:
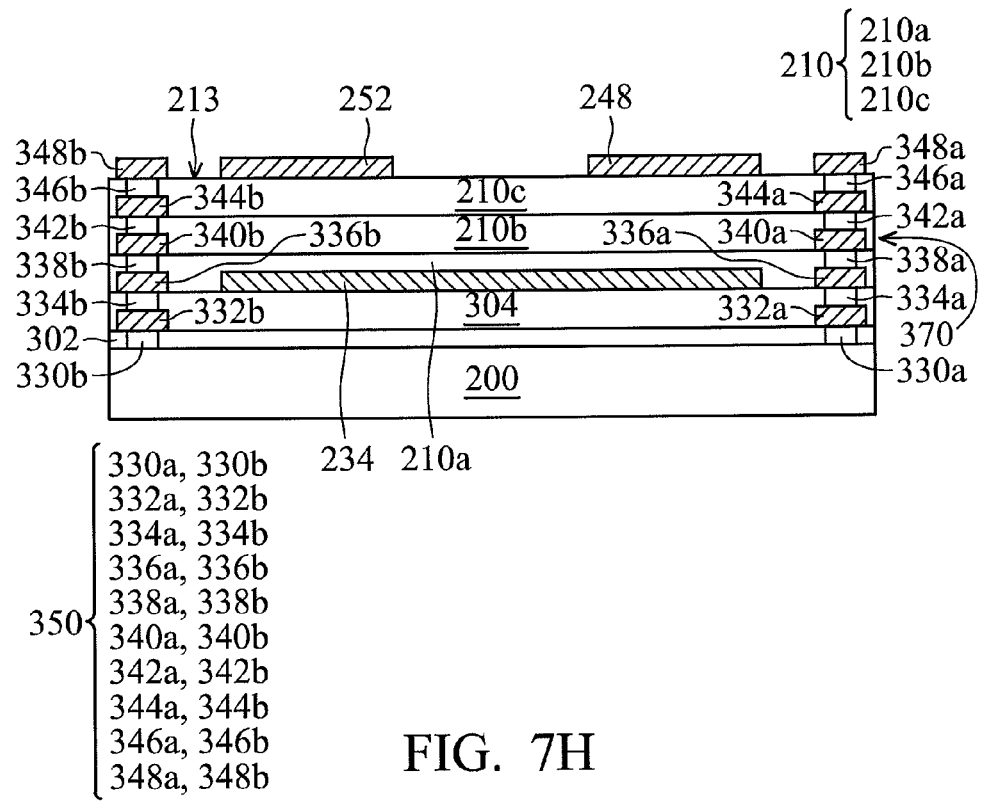

Next, as shown in FIG. 7H, processes similar to the processes as shown in FIG. 6E are performed to form metal layer patterns 348a, 348b, 248 and 252 on the dielectric layer 210c. The metal layer patterns 348a, 348b, 248 and 252 are separated from each other. In this embodiment, the metal layer patterns 348a and 348b are respectively connected to the via plugs 346a and 346b. Also, the metal layer patterns 248 and 252 are designed to be overlapping with the metal layer pattern 234. In this embodiment, an arrangement and layered-level of the metal layer patterns 234, 248 and 252 as shown in FIG. 7H are similar to FIG. 6E. In one embodiment as shown in FIG. 7H, the vertically laminated dielectric layers 210a, 210b and 210c are composed of an inter-metal dielectric (IMD) layer structure 210. In addition, the IMD layer structure 210, the metal layer patterns 234, 248, 252, 332a, 332b, 336a, 336b, 340a, 340b, 344a and 344b, and the via plugs 330a, 330b, 334a, 334b, 338a, 338b, 342a, 342b, 346a and 346b are composed of an interconnection 370 of an electrical die.

As shown in FIG. 7H, a seal ring structure 350 is formed in the IMD layer structure 210 during the formation of the interconnection structure 370. The seal ring structure 350 is formed surrounding the metal layer patterns 234, 248 and 252. In this embodiment, the seal ring structure 350 is composed by the via plugs 330a, 330b, 334a, 334b, 338a, 338b, 342a, 342b, 346a and 346b respectively formed through the dielectric layers 302, 304, 210a, 210b and 210c, and the metal layer patterns 332a, 332b, 336a, 336b, 340a, 340b, 344a and 344b alternatively laminating with the dielectric layers 302, 304, 210a, 210b and 210c. The via plugs 330a, 330b, 334a, 334b, 338a, 338b, 342a, 342b, 346a and 346b, and the metal layer patterns 332a, 332b, 336a, 336b, 340a, 340b, 344a and 344b are vertically laminated and interconnected to each other.

Figure 7I:
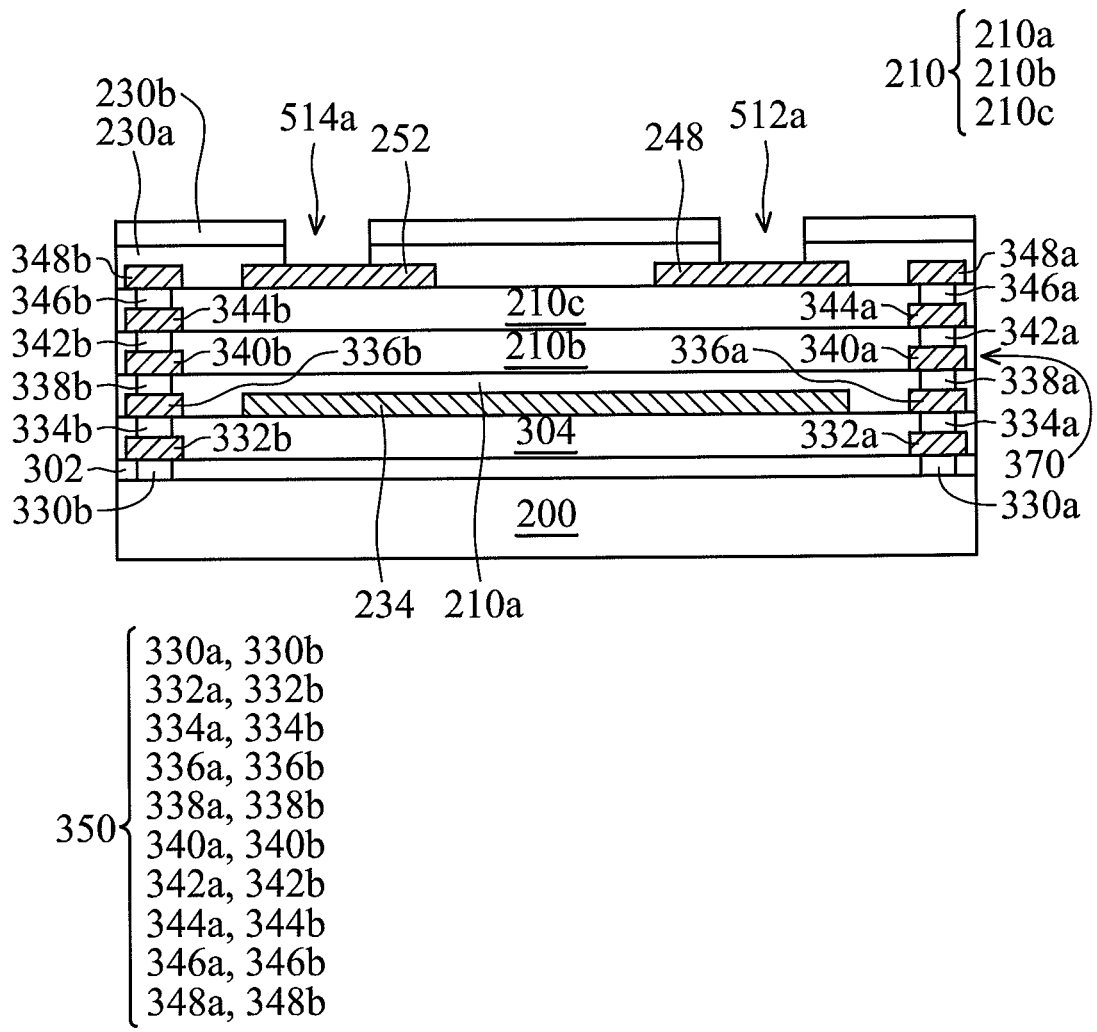
Figure 7J:
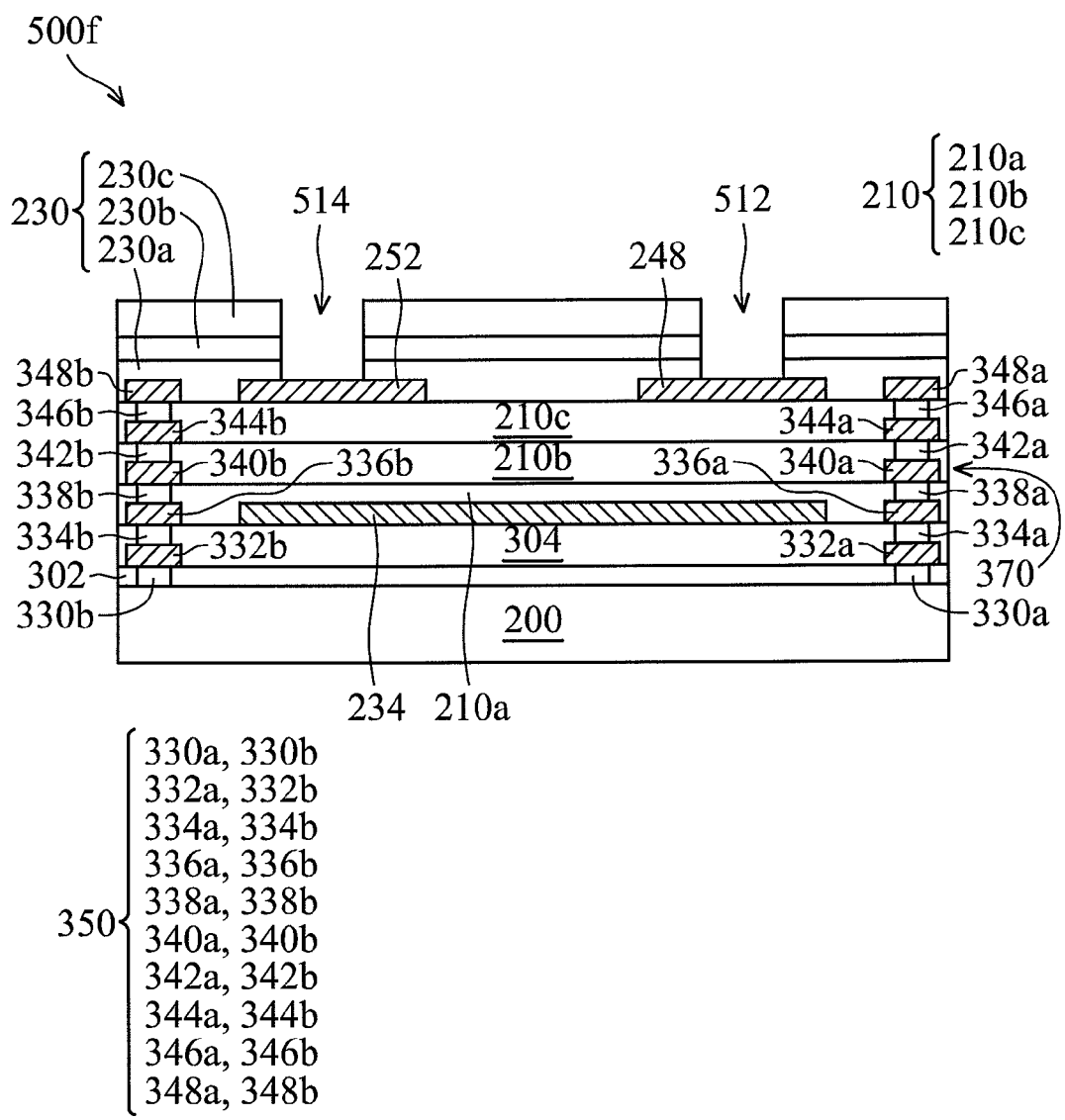

FIGS. 7I and 7J illustrate a formation of a protective (protection) layer structure. Next, please refer to FIG. 7I, processes similar to the processes as shown in FIGS. 6F and 6G may be performed to form protective layers 230a and 230b, which have openings 512a and 514a passing therethrough, on the interconnection structure 370. Next, a protective layer 230c is formed on the protective layers 230a and 230b. Next, openings 512 and 514 are formed through the protective layers 230a, 230b and 230c. Portions of the metal layer patterns 248 and 252 are exposed to the openings 512 and 514 to define wire bonding locations of subsequent bonding wires. In one embodiment, the protective layers 230a, 230b and 230c are composed of a protective layer structure 230. After performing the aforementioned processes, one embodiment of the electrical die 500f of a galvanically-isolated device is completely fabricated.

Figure 7K:
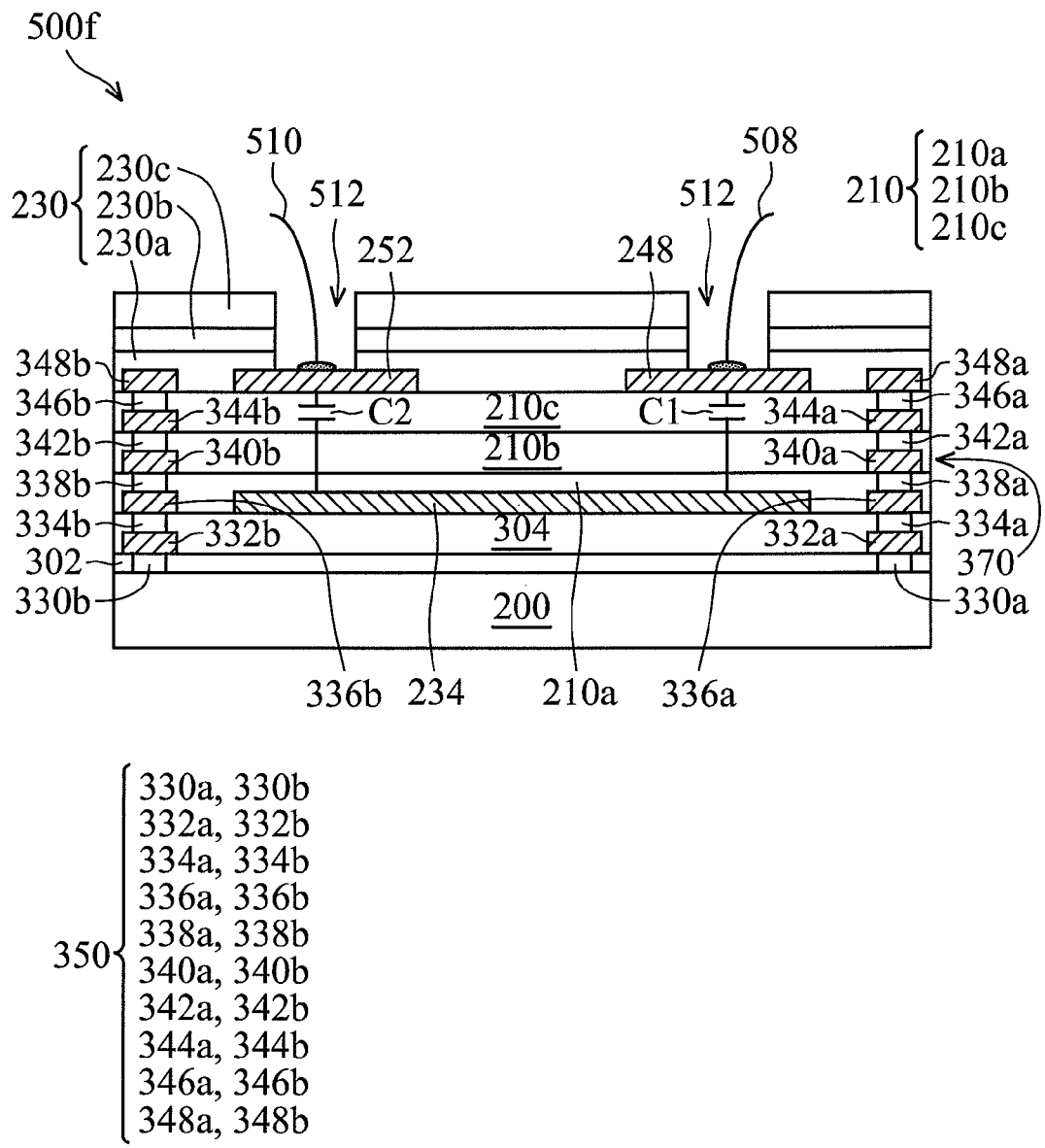

Next, please refer to FIG. 7K, processes similar to the wire bonding process as shown in FIG. 6H are performed to bond the bonding wires 508 and 510 directly onto the metal layer patterns 248 and 252 by passing through the openings 512 and 514 of protective layer structure 230, respectively. In this embodiment, an arrangement and connection of the high-voltage semiconductor capacitor of the electrical die 500f may be similar to those of the electrical die 500e. Alternatively, a layered-level of the metal layer pattern 234 and a layered-level of the metal layer patterns 248 and 252 can be exchanged, thereby forming the electrical die 500a similarly to FIG. 2A. Also, the metal layer patterns 248 and 252 may be electrically connected to the bonding wires 508 and 510 by a via-plug lamination structures formed through an IMD layer structure (the via-plug lamination structures 212 as shown in FIG. 2A) and bonding pads (the bonding pads 216 as shown in FIG. 2A) on the via-plug lamination structures.

Figure 8A:
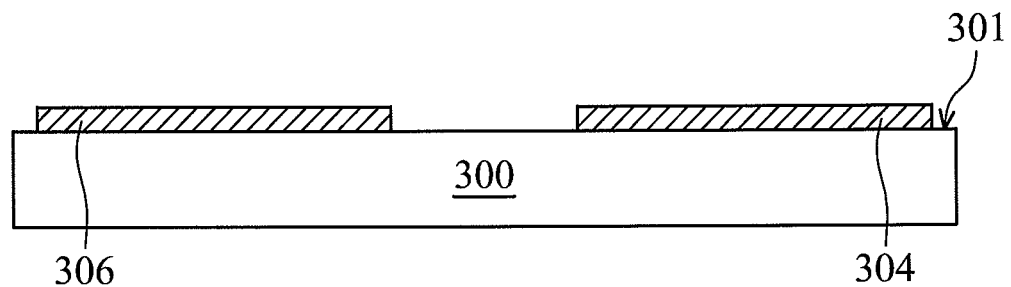
FIGS. 8A-8F are cross-sectional schematic diagrams showing intermediate stages of yet another embodiment of a method for fabricating an electrical die of a galvanically-isolated device of the invention.

FIGS. 8A-8F are cross-sectional schematic diagrams showing intermediate stages of yet another embodiment of a method for fabricating an electrical die 500g of a galvanically-isolated device of the invention. In this embodiment, the electrical die 500g is fabricated using a nonconductive substrate such as a glass substrate. As shown in FIG. 8A, a substrate 300 is provided. Next, a deposition process and a subsequent patterning process are performed to form metal layer patterns 304 and 306 on a top surface 301 of the substrate 300. The metal layer patterns 304 and 306 are separated from each other. In one embodiment, the metal layer patterns 304 and 306 are formed at the same interconnection metal-layered level.

Figure 8B:
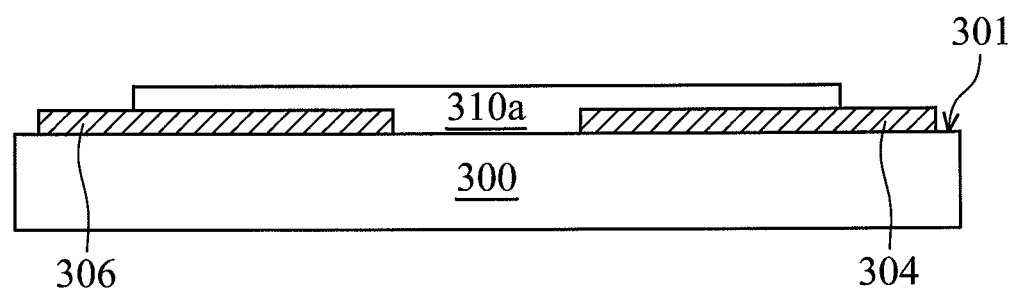

Next, please refer to FIG. 8B, another deposition process and a subsequent patterning process are performed to form a dielectric layer pattern 310a. In one embodiment, the dielectric layer pattern 310a covers portions of the metal layer patterns 304 and 306. Additionally, the dielectric layer pattern 310a not only serves as a dielectric of a final high-voltage semiconductor capacitor, but also serves as a planarized layer. Therefore, an electrically floating plate of a final high-voltage semiconductor capacitor may be formed on a planarized surface. As shown in FIG. 8B, portions of the metal layer patterns 304 and 306, which are close to an edge of the surface 300, not covered by the dielectric layer pattern 310a are exposed. In one embodiment, the dielectric layer pattern 310a may be formed of material including silicon oxide, polymer or combinations thereof.

Figure 8C:
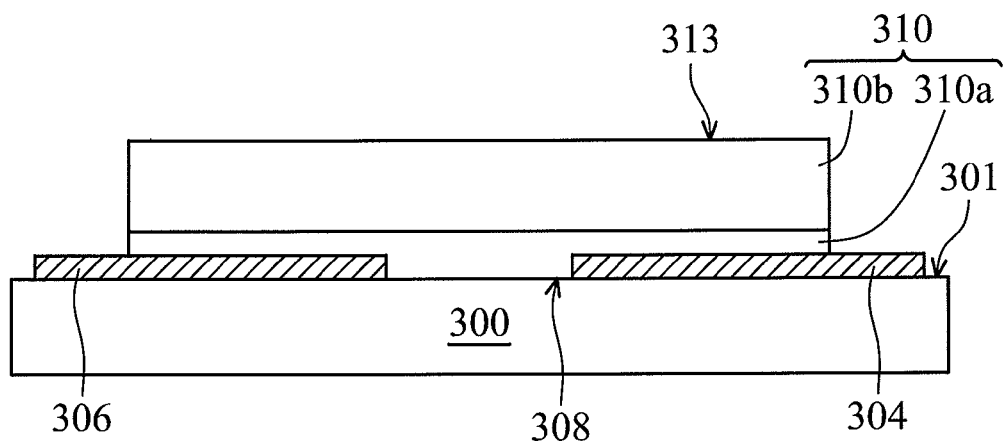

Next, please refer to FIG. 8C, another deposition process and a subsequent patterning process are performed to form a dielectric layer pattern 310b on the dielectric layer pattern 310a. In one embodiment, the dielectric layer pattern 310b may be formed of material including silicon oxide, polymer or combinations thereof. In one embodiment, a sidewall of the dielectric layer pattern 310b is aligned to a sidewall of the dielectric layer pattern 310a. In one embodiment, the dielectric layer patterns 310a and 310b are composed of an intermetal dielectric (IMD) layer structure 310.

Figure 8D:
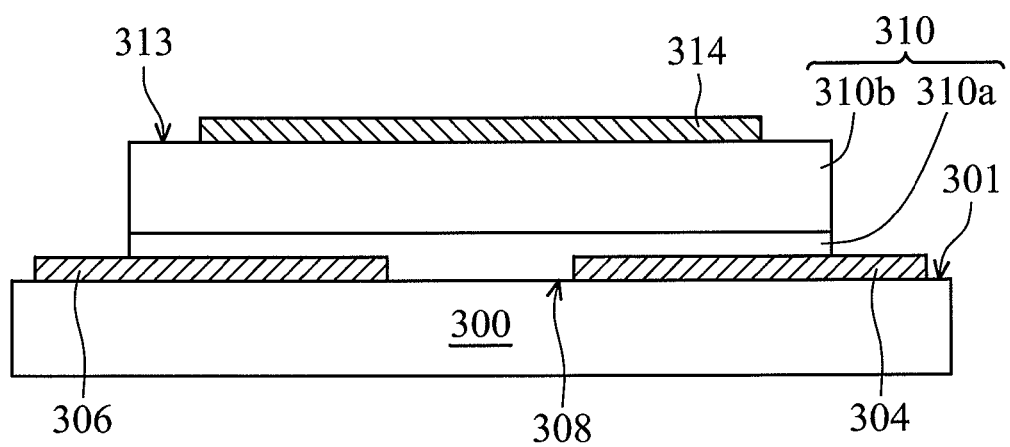

Next, please refer to FIG. 8D, another deposition process and a subsequent patterning process are performed to form a metal layer pattern 314 on the inter-metal dielectric (IMD) layer structure 310. In one embodiment, the metal layer pattern 314 overlaps with both the metal layer patterns 304 and 306.

Figure 8E:
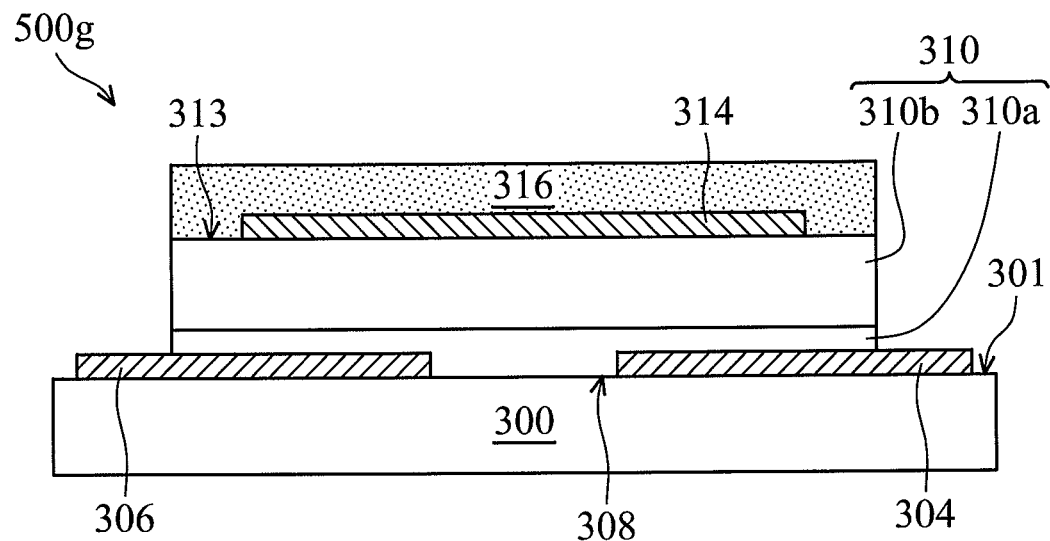

Next, please refer to FIG. 8E, another deposition process and a subsequent patterning process are performed to form a protective layer 316 on the inter-metal dielectric (IMD) layer structure 310, covering the metal layer pattern 314 and a top surface 313 of the inter-metal dielectric (IMD) layer structure 310. As shown in FIG. 8E, portions of the metal layer patterns 304 and 306, which are close to an edge of the surface 300, not covered by the inter-metal dielectric (IMD) layer structure 310 and the protective layer 316 are exposed. After performing the aforementioned processes, one embodiment of the electrical die 500g of a galvanically-isolated device is completely fabricated.

Figure 8F:
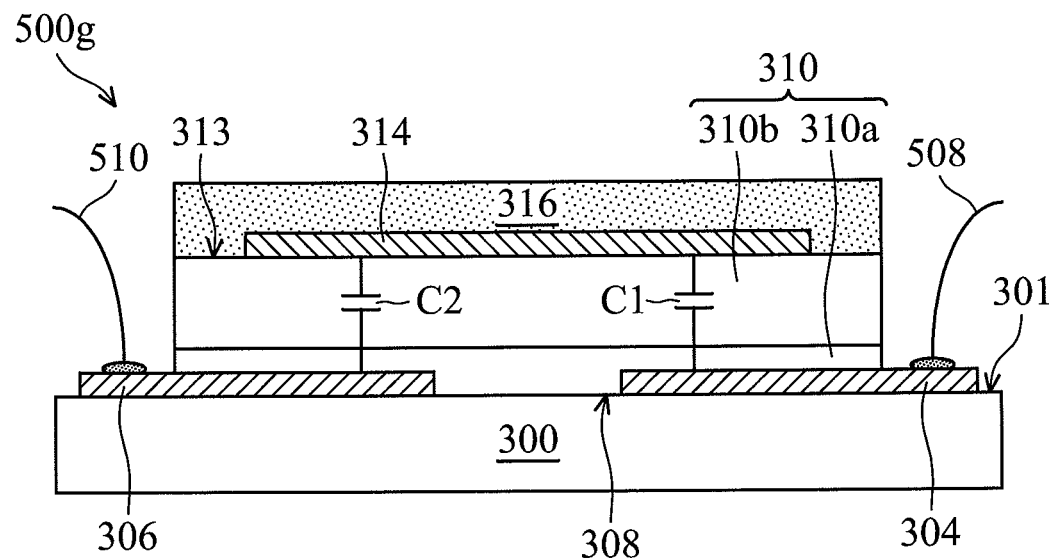

Next, please refer to FIG. 8F, a wire bonding process is performed to bond the bonding wires 508 and 510 directly onto the exposed portions of the metal layer patterns 304 and 306, respectively. Differences between the electrical die 500g as shown FIG. 8E and the electrical die 500d as shown in FIG. 5 are that the inter-metal dielectric (IMD) layer structure 310 of the electrical die 500g is designed to cover portions of the metal layer patterns 304 and 306. Also, the exposed portions of the metal layer patterns 304 and 306 can facilitate the bonding wires 508 and 510 bonding directly on the metal layer patterns 304 and 306. Also, the metal layer pattern 314 is electrically floating. In other embodiments, a dielectric layer is deposited. Then, the dielectric layer is subjected to a photolithography process and an etching process to define the exposed portions of the metal layer patterns 304 and 306. The exposed portions of the metal layer patterns 304 and 306 can facilitate the bonding wires 508 and 510 bonding directly on the metal layer patterns 304 and 306. Therefore, an electrical die similar to the electrical die 500d as shown in FIG. 5 is formed.

Figure 10A:
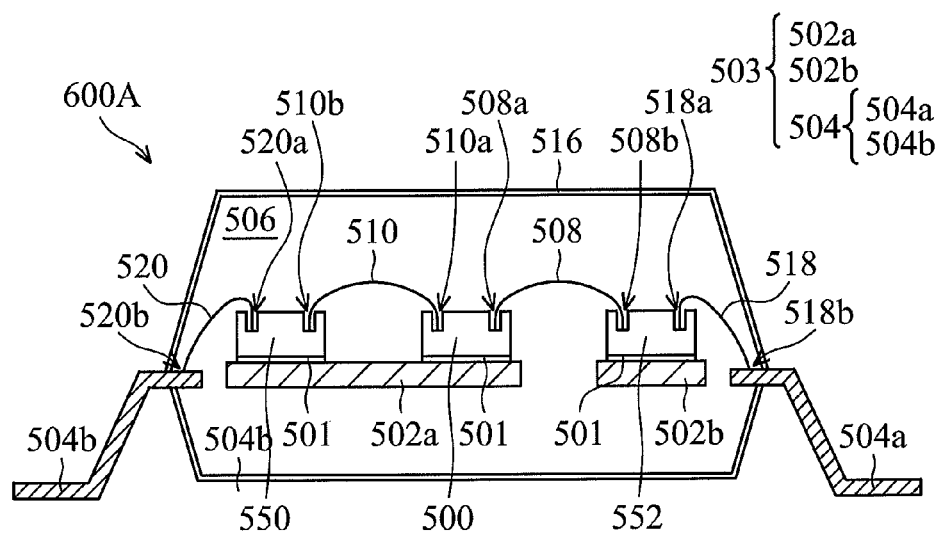
FIGS. 10A and 10B show cross sectional diagrams of other embodiments of a galvanically-isolated device.
Figure 10B:
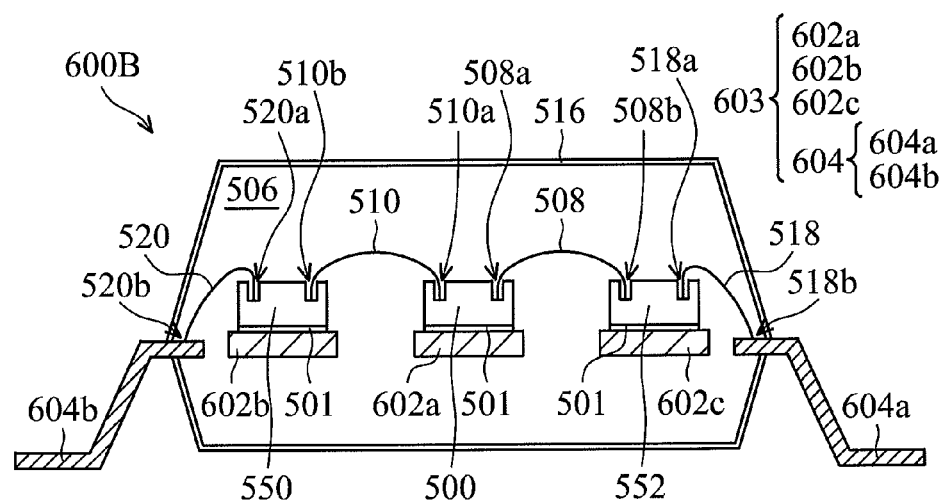

In other embodiments, multi-galvanically-isolated device packages with a single-die-attach pad (paddle), double die-attach pads (paddle) or multi die-attach pads (paddle) can designed to integrate a numbers of electrical dies with different breakdown voltages in a single semiconductor package. For example, multi-chip galvanically-isolated device packages can be designed to integrate the electrical dies including high-voltage capacitor dies, sensing device dies or other integrated circuit device dies using a die mounting process and a wire bonding process. FIGS. 10A and 10B show cross sectional diagrams of other embodiments of galvanically-isolated devices 600A and 600B. In one embodiment, the galvanically-isolated device 600A is a semiconductor package with double die-attach pads for packaging three electrical dies as shown in FIG. 10A. As shown in FIG. 10A, a lead frame 503 of the galvanically-isolated device 600A includes two die-attach pads 502a and 502b separated from each other, and leads 504 (including leads 504a and 504b). In this embodiment, two electrical dies including a first electrical die (high-voltage capacitor die) 500 and second electrical die 550 with similar breakdown voltages are mounted on the die-attach pad 502a by an adhesive material 501 by a die mounting process. A third electrical die 552 with a breakdown voltage much different than the two electrical dies is mounted on the die-attach pad 502b by the adhesive material 501 by another die mounting process. A wire bonding process is performed, such that the second electrical die 550 mounted on the die-attach pad 502a is electrically connected to a terminal 510b of a bonding wire 510 and a terminal 520a of a bonding wire 520. Also, the second electrical die 550 is electrically connected to the first electrical die (high-voltage capacitor die) 500 by a terminal 510a of a bonding wire 510. Further, the second electrical die 550 is electrically connected to the lead 504b by the terminal 520b of the bonding wire 520. Additionally, the first electrical die (high-voltage capacitor die) 500 mounted on the die-attach pad 502a is electrically connected to a terminal 510a of the bonding wire 510 and a terminal 508a of a bonding wire 508. Also, the first electrical die (high-voltage capacitor die) 500 is electrically connected to the third electrical die 552 mounted on the die-attach pad 502b by the terminal 508b of the bonding wire 508. Further, the third electrical die 552 is electrically connected to a terminal 518a of a bonding wire 518 and the terminal 508b of the bonding wire 508. Also, the third electrical die 552 is electrically connected to the lead 504a by a terminal 518b of the bonding wire 518. In this embodiment, the first electrical die 500, the second electrical die 550, the third electrical die 552 and the bonding wires 508, 510, 518 and 520 are encapsulated by a molding material 506.

In another embodiment, the galvanically-isolated device 600B is a semiconductor package with three die-attach pads for packaging three electrical dies as shown in FIG. 10B. As shown in FIG. 10B, a lead frame 603 of the galvanically-isolated device 600B includes three die-attach pads 602a, 602b and 602c separated from each other, and leads 604 (including leads 604a and 604b). In this embodiment, three electrical dies, including the first electrical die 500, the second electrical die 550 the third electrical die 552, are mounted on the three die-attach pads 602a, 602b and 602c by an adhesive material 501 by a die mounting process, respectively. A wire bonding process is performed, such that the first electrical die (high-voltage capacitor die) 500 mounted on the die-attach pad 602a is electrically connected to a terminal 510a of the bonding wire 510 and a terminal 508a of a bonding wire 508. Also, the first electrical die (high-voltage capacitor die) 500 is electrically connected to the second electrical die 550 by the bonding wire 510. Further, the first electrical die (high-voltage capacitor die) 500 is electrically connected to the third electrical die 552 mounted on the die-attach pad 602c by the bonding wire 508. The second electrical die 550 mounted on the die-attach pad 602b is electrically connected to a terminal 510b of a bonding wire 510 and a terminal 520a of a bonding wire 520. Also, the second electrical die 550 is electrically connected to the lead 604b by the bonding wire 520. Additionally, the third electrical die 552 is electrically connected to a terminal 518a of a bonding wire 518 and the terminal 508b of the bonding wire 508. Also, the third electrical die 552 is electrically connected to the lead 604a by the bonding wire 518. In this embodiment, the first electrical die 500, the second electrical die 550, the third electrical die 552 and the bonding wires 508, 510, 518 and 520 are encapsulated by a molding material 506.

Embodiments provide a galvanically-isolated device including a high-voltage semiconductor capacitor die (electrical die) and a method for fabricating the same. The electrical die is fabricated by a wafer level manufacturing process. The electrical die includes several capacitors connected in series. The capacitors are composed of a plurality of discrete plates (interconnection-level metal layers), which are arranged staggered on a top and bottom surfaces of an inter-metal dielctric (IMD) layer structure of an interconnection structure, and the inter-metal dielctric (IMD) layer structure between the discrete plates. Also, a thickness of a dielectric of each of the capacitors is the same as a thickness of the IMD layer structure. Therefore, a breakdown voltage of one embodiment of the electrical die (high voltage capacitor die) can be improved without increasing the thickness of the IMD layer structure. Further, arrangements of the discrete plates (interconnection-level metal layers) of the high-voltage semiconductor capacitor die (electrical die) may result in a more flexible design choice in materials for forming the substrate. For example, a glass wafer with a large hardness value can be used, such that the plates (interconnection-level metal layers) can be disposed directly on a top surface of the glass wafer to facilitate processing a wire bonding process. Moreover, the high-voltage semiconductor capacitor die (electrical die) using a glass wafer to combine with the arrangements of the discrete plates (interconnection-level metal layers) may simplify the fabrication processes of the dielectric of the high-voltage semiconductor capacitor. For example, the dielectric of the high-voltage semiconductor capacitor may be formed of polymer. Also, embodiments provide multi-galvanically-isolated device packages with a single-die-attach pad (paddle), double die-attach pads (paddle) or multi die-attach pads (paddle) to integrate a numbers of electrical dies with different breakdown voltages in a single semiconductor package.

While the invention has been described by way of example and in terms of the embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A galvanically-isolated device, comprising:
a lead frame comprising a first die-attach pad, a first lead and a second lead;
a substrate disposed on the first die-attach pad;
a high-voltage semiconductor capacitor formed on the substrate, comprising:
an interconnection structure, comprising:
an inter-metal dielectric layer structure; and
a first plate, a second plate and a third plate on the inter-metal dielectric layer structure, separated from each other;
wherein the first plate, the second plate and a first portion of the inter-metal dielectric layer structure overlapping with both the first plate and the second plate are composed of a first capacitor, and
wherein the first plate, the third plate and a second portion of the inter-metal dielectric layer structure overlapping with both the first plate and the third plate are composed of a second capacitor connected in series with the first capacitor;
a first bonding wire electrically connected between the second plate and the first lead;
a second bonding wire electrically connected between the third plate and the second lead; and
a molding compound layer encapsulating the high-voltage semiconductor capacitor, the first die-attach pad, the first bonding wire and the second bonding wire.

2. The galvanically-isolated device as claimed in claim 1, wherein the high-voltage semiconductor capacitor further comprises a protective layer formed on the interconnection structure, wherein the protective layer is formed of a material comprising polyimide.

3. The galvanically-isolated device as claimed in claim 2, wherein the protective layer has two openings for the first and second bonding wires passing therethrough, respectively.

4. The galvanically-isolated device as claimed in claim 3, wherein the substrate and the high-voltage semiconductor capacitor are composed of a first electrical die.

5. The galvanically-isolated device as claimed in claim 4, wherein the substrate is a nonconductive substrate.

6. The galvanically-isolated device as claimed in claim 5, wherein the first plate is a topmost interconnection-level metal layer, and wherein the second plate and the third plate are interconnection-level metal layers beneath the topmost interconnection-level metal layer.

7. The galvanically-isolated device as claimed in claim 5, wherein the high-voltage semiconductor capacitor further comprises a seal ring structure surrounding the first plate, the second plate and the third plate.

8. The galvanically-isolated device as claimed in claim 5, wherein the lead frame further comprises:
a second die-attach pad separated from the first die-attach pad; and
a second electrical die disposed on the second die-attach pad, wherein the molding compound layer encapsulates the second electrical die.

9. The galvanically-isolated device as claimed in claim 8, further comprising a third electrical die disposed on the first die-attach pad, wherein the molding compound layer encapsulates the third electrical die.

10. The galvanically-isolated device as claimed in claim 8, further comprising:
a third die-attach pad separated from the first die-attach pad and the second die-attach pad; and
a third electrical die disposed on the third die-attach pad, wherein the molding compound layer encapsulates the third electrical die.

11. The galvanically-isolated device as claimed in claim 4, wherein the substrate is a silicon substrate.

12. The galvanically-isolated device as claimed in claim 11, further comprising:
a first bonding pad formed on the interconnection structure, coupled to the second plate; and
a second pad formed on the interconnection structure, coupled to the third plate.

13. The galvanically-isolated device as claimed in claim 11, further comprising a first dielectric layer formed on a top surface of the silicon substrate.

14. The galvanically-isolated device as claimed in claim 13, wherein the first plate is a bottommost interconnection-level metal layer, and wherein the second plate and the third plate are interconnection-level metal layers above the bottommost interconnection-level metal layer.

15. The galvanically-isolated device as claimed in claim 14, wherein the protective layer of the high-voltage semiconductor capacitor is formed of the material comprising polyimide, oxide, nitride or combinations thereof.

16. The galvanically-isolated device as claimed in claim 15, wherein the high-voltage semiconductor capacitor further comprises a seal ring structure surrounding the first plate, the second plate and the third plate.

17. The galvanically-isolated device as claimed in claim 11, wherein the lead frame further comprises:
  a second die-attach pad separated from the first die-attach pad; and
  a second electrical die disposed on the second die-attach pad, wherein the molding compound layer encapsulates the second electrical die.

18. The galvanically-isolated device as claimed in claim 17, further comprising a third electrical die disposed on the first die-attach pad, wherein the molding compound layer encapsulates the third electrical die.

19. The galvanically-isolated device as claimed in claim 17, further comprising:
  a third die-attach pad separated from the first die-attach pad) and the second die-attach pad; and
  a third electrical die disposed on the third die-attach pad, wherein the molding compound layer encapsulates the third electrical die.

20. A method for fabricating a galvanically-isolated device, comprising:
  providing the first electrical die as claimed in claim 4;
  disposing the first electrical die on the first die-attach pad of the lead frame;
  performing a wire bonding process to electrically connect the second plate and the first lead by the first bonding wire and electrically connect the third plate and the second lead by the second bonding wire; and
  forming the molding compound layer encapsulating the first electrical die, the first die-attach pad, the first bonding wire and the second bonding wire.

21. The method for fabricating a galvanically-isolated device as claimed in claim 20, wherein the protective layer is formed by a redistribution layer (RDL) process.

22. The method for fabricating a galvanically-isolated device as claimed in claim 20, wherein the lead frame further comprises:
  a second die-attach pad separated from the first die-attach pad.

23. The method for fabricating a galvanically-isolated device as claimed in claim 22, further comprising:
  disposing a second electrical die on the second die-attach pad, wherein the molding compound layer encapsulates the first electrical die; and
  disposing a third electrical die on the first die-attach pad, wherein the molding compound layer encapsulates the third electrical die;
  wherein the wire bonding process further comprises electrically connecting the second plate of the first electrical die and the second electrical die by the first bonding wire, electrically connecting the third plate of the first electrical die and the third electrical die by the second bonding wire, electrically connecting the second electrical die and the first lead by a third bonding wire, and electrically connect the third electrical die and the second lead by a fourth bonding wire.

24. The method for fabricating a galvanically-isolated device as claimed in claim 22, wherein the lead frame further comprises:
  a third die-attach pad separated from the first die-attach pad and the second die-attach pad.

25. The method for fabricating a galvanically-isolated device as claimed in claim 24, further comprising:
  disposing a second electrical die on the second die-attach pad, wherein the molding compound layer encapsulates the first electrical die;
  disposing a third electrical die on the third die-attach pad, wherein the molding compound layer encapsulates the third electrical die;
  wherein the wire bonding process further comprises electrically connecting the second plate of the first electrical die and the third electrical die by the first bonding wire, electrically connecting the third plate of the first electrical die and the second electrical die by the second bonding wire, electrically connect the third electrical die and the first lead by a third bonding wire, and electrically connecting the second electrical die and the second lead by a fourth bonding wire.

* * * * *